United States Patent
Yamazawa

(10) Patent No.: US 10,679,867 B2
(45) Date of Patent: *Jun. 9, 2020

(54) PLASMA PROCESSING APPARATUS

(71) Applicant: TOKYO ELECTRON LIMITED, Tokyo (JP)

(72) Inventor: Yohei Yamazawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 302 days.

This patent is subject to a terminal disclaimer.

(21) Appl. No.: 15/590,356

(22) Filed: May 9, 2017

(65) Prior Publication Data
US 2017/0330772 A1    Nov. 16, 2017

(30) Foreign Application Priority Data

May 12, 2016  (JP) .................................. 2016-096224

(51) Int. Cl.
*H01L 21/00*      (2006.01)
*H01L 21/67*      (2006.01)
(Continued)

(52) U.S. Cl.
CPC ..... *H01L 21/67063* (2013.01); *H01F 21/005* (2013.01); *H01F 21/04* (2013.01);
(Continued)

(58) Field of Classification Search
USPC .................................. 156/345.47; 118/723 E
See application file for complete search history.

(56) References Cited

U.S. PATENT DOCUMENTS 4,871,421 A * 10/1989 Ogle ................. H01J 37/32082
                                                              438/710
5,147,493 A *  9/1992 Nishimura ........ H01J 37/32082
                                                              118/723 E
(Continued)

FOREIGN PATENT DOCUMENTS

GB              2206251   * 12/1988  ............... H03H 7/38
JP        H02-501608 A      5/1990
(Continued)

*Primary Examiner* — Ram N Kackar
(74) *Attorney, Agent, or Firm* — Nath, Goldberg & Meyer; Jerald L. Meyer

(57) ABSTRACT

A capacitively-coupled plasma processing apparatus includes: at least one chamber body providing chambers separated from each other; upper electrodes respectively installed in upper spaces within the chambers; lower electrodes respectively installed in lower spaces within the chambers; a high frequency power supply; a transformer including a primary coil electrically connected to the high frequency power supply, and secondary coils each of which coils having a first end and a second end; first condensers respectively connected between each of the first ends of the secondary coils and the upper electrodes; and second condensers respectively connected between each of the second ends of the secondary coils and the lower electrodes. The primary coil extends around a central axis. The secondary coils are configured to be coaxially disposed with respect to the primary coil. A self-inductance of each of the secondary coils is smaller than that of the primary coil.

10 Claims, 23 Drawing Sheets

(51) Int. Cl.
  *H01J 37/32* (2006.01)
  *H01F 21/00* (2006.01)
  *H01F 21/04* (2006.01)
  *H01L 21/3065* (2006.01)
  *H05K 9/00* (2006.01)
  *H01F 30/04* (2006.01)
  *H02M 1/00* (2006.01)

(52) U.S. Cl.
  CPC .. *H01J 37/32091* (2013.01); *H01J 37/32174* (2013.01); *H01J 37/32899* (2013.01); *H01L 21/3065* (2013.01); *H05K 9/0007* (2013.01); *H01F 30/04* (2013.01); *H02M 2001/007* (2013.01)

(56) References Cited

U.S. PATENT DOCUMENTS

| | | | | |
|---|---|---|---|---|
| 5,665,167 A | * | 9/1997 | Deguchi | C23C 14/50 118/723 E |
| 5,795,452 A | * | 8/1998 | Kinoshita | C23C 16/5096 118/723 E |
| 6,155,198 A | * | 12/2000 | Danek | C23C 16/34 118/723 E |

FOREIGN PATENT DOCUMENTS

| | | |
|---|---|---|
| JP | H04-302409 A | 10/1992 |
| JP | H06-244151 A | 9/1994 |
| JP | H10-111118 A | 4/1998 |
| JP | 2014-89876 A | 5/2014 |
| KR | 10-2009-0056197 A | 6/2009 |

\* cited by examiner

PLASMA PROCESSING APPARATUS

CROSS-REFERENCE TO RELATED APPLICATION

This application claims the benefit of Japanese Patent Application No. 2016-096224, filed on May 12, 2016, in the Japan Patent Office, the disclosure of which is incorporated herein in its entirety by reference.

TECHNICAL FIELD

The present disclosure relates to a plasma processing apparatus.

BACKGROUND

In manufacturing electronic devices such as semiconductor devices, a plasma processing apparatus is used for processes such as etching and film formation. A capacitively-coupled plasma processing apparatus is known as one type of plasma processing apparatus. The capacitively-coupled plasma processing apparatus generally includes a chamber body, an upper electrode, and a lower electrode. The upper electrode and the lower electrode are disposed such that a space within a chamber provided by the chamber body is defined therebetween. In this plasma processing apparatus, a gas is supplied to the chamber to form a high frequency electric field between the upper electrode and the lower electrode. The gas is excited by the high frequency electric field to generate plasma. A workpiece is processed by ions and/or radicals generated from the plasma.

In the related art, a plasma processing apparatus configured to form a high frequency electric field within a plurality of chambers using a single high frequency power supply is known as one type of the capacitively-coupled plasma processing apparatus. Such a plasma processing apparatus includes a plurality of upper electrodes, a plurality of lower electrodes, a primary coil, and a plurality of secondary coils. The plurality of upper electrodes is respectively installed in upper spaces within the plurality of chambers, and the plurality of lower electrodes is respectively installed in lower spaces within the plurality of chambers. A high frequency power supply is connected to the primary coil. The primary coil and the plurality of secondary coils are electronically coupled to each other. One end of the plurality of secondary coils is respectively connected to the plurality of upper electrodes. The other ends of the plurality of secondary coils are respectively connected to the plurality of lower electrodes. A plurality of variable condensers is respectively connected between the other ends of the plurality of secondary coils and the plurality of lower electrodes. These variable condensers are installed to reduce impedance of a closed circuit including the plurality of secondary coils.

In this type of plasma processing apparatus, i.e., the plasma processing apparatus configured to form a high frequency electric field within the plurality of chambers using a single high frequency power supply, it is required to enhance the efficiency of power supply to the electrodes for the plurality of chambers.

SUMMARY

Some embodiments of the present disclosure provide to a plasma processing apparatus capable of enhancing the efficiency of power supply to electrodes for a plurality of chambers.

According to an embodiment of the present disclosure, a capacitively-coupled plasma processing apparatus, including: at least one chamber body providing a plurality of chambers separated from each other, the at least one chamber body being grounded; a plurality of upper electrodes respectively installed in upper spaces within the plurality of chambers; a plurality of lower electrodes respectively installed in lower spaces within the plurality of chambers; a high frequency power supply; a transformer including a primary coil electrically connected to the high frequency power supply, and a plurality of secondary coils, each of the plurality of secondary coils having a first end and a second end; a plurality of first condensers respectively connected between each of the first ends of the plurality of secondary coils and the plurality of upper electrodes; and a plurality of second condensers respectively connected between each of the second ends of the plurality of secondary coils and the plurality of lower electrodes, wherein the primary coil extends around a central axis, the plurality of secondary coils is configured to be coaxially disposed with respect to the primary coil, and a self-inductance of each of the plurality of secondary coils is smaller than that of the primary coil.

According to another embodiment of the present disclosure, a capacitively-coupled plasma processing apparatus, including: at least one chamber body providing two chambers separated from each other, the at least one chamber body being grounded; two upper electrodes respectively installed in upper spaces within the two chambers; two lower electrodes respectively installed in lower spaces within the two chambers; a high frequency power supply; a transformer including a primary coil electrically connected to the high frequency power supply and a plurality of secondary coils composed of two secondary coils; two first condensers respectively connected between a first end of one of the two secondary coils and one of the two upper electrodes, and between a second end of one of the two secondary coils and the other of the two upper electrodes; and two second condensers respectively connected between a first end of the other of the two secondary coils and one of the two lower electrodes, and between the second end of the other of the two secondary coils and the other of the two lower electrodes, wherein the primary coil extends around a central axis, the plurality of secondary coils is configured to be coaxially disposed with respect to the primary coil, each of the first ends of the two second condensers is respectively connected to one of the two lower electrodes, each of the second ends of the two second condensers floats from a ground electric potential, and a self-inductance of each of the two secondary coils is smaller than that of the primary coil

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
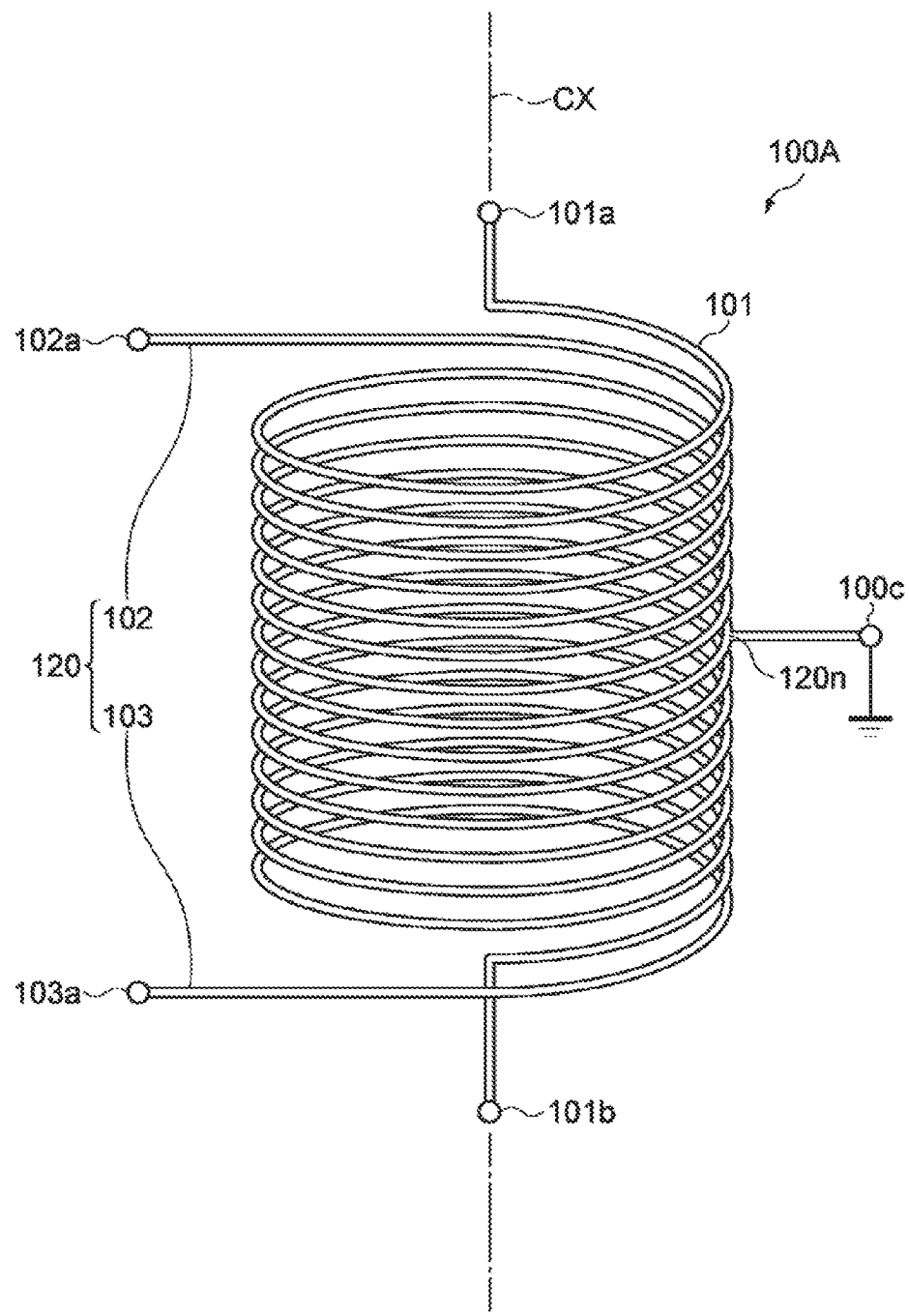
FIG. 1 is a diagram illustrating a transformer according to an embodiment of the present disclosure.

Embodiments of the present disclosure will now be described in detail with reference to the accompanying drawings. Further, the same or equivalent parts in the drawings will be denoted by the same reference numerals. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First, some embodiments of a transformer that can be used in various embodiments of a plasma processing apparatus to be described later will be described. FIG. 1 is a diagram illustrating a transformer according to an embodiment of the present disclosure. A transformer 100A illustrated in FIG. 1 includes a primary coil 101, a pair of secondary coils, i.e., two secondary coils 102 and 103.

A winding of the primary coil 101 is spirally wound around a central axis CX. One end of the primary coil 101 is a terminal 101a, and the other end thereof is a terminal 101b. The secondary coil 102 and the secondary coil 103 are installed coaxially with the primary coil 101. A winding of the secondary coil 102 is spirally wound around the central axis CX in an alternate relationship with the winding of the primary coil 101. A winding of the secondary coil 103 is spirally wound around the central axis CX in an alternate relationship with the winding of the primary coil 101.

In the transformer 100A, the secondary coil 102 and the secondary coil 103 are formed as a single coil 120. Specifically, in the transformer 100A, a central node 120n of the winding of the coil 120 is connected to a terminal 100c, which is grounded. One end of the coil 120 is a terminal 102a, and the other end of the coil 120 is a terminal 103a. A winding between the terminal 102a and the node 120n constitutes the secondary coil 102. A winding between the terminal 103a and the node 120n constitutes the secondary coil 103.

A self-inductance of each of the secondary coil 102 and the secondary coil 103 is smaller than that of the primary coil 101. Therefore, in an embodiment, the number of turns of each of the secondary coil 102 and the secondary coil 103 may be about half of the number of turns of the primary coil 101. Further, each of the secondary coil 102 and the secondary coil 103 may have substantially the same sectional area as that of the primary coil 101.

Figure 2:
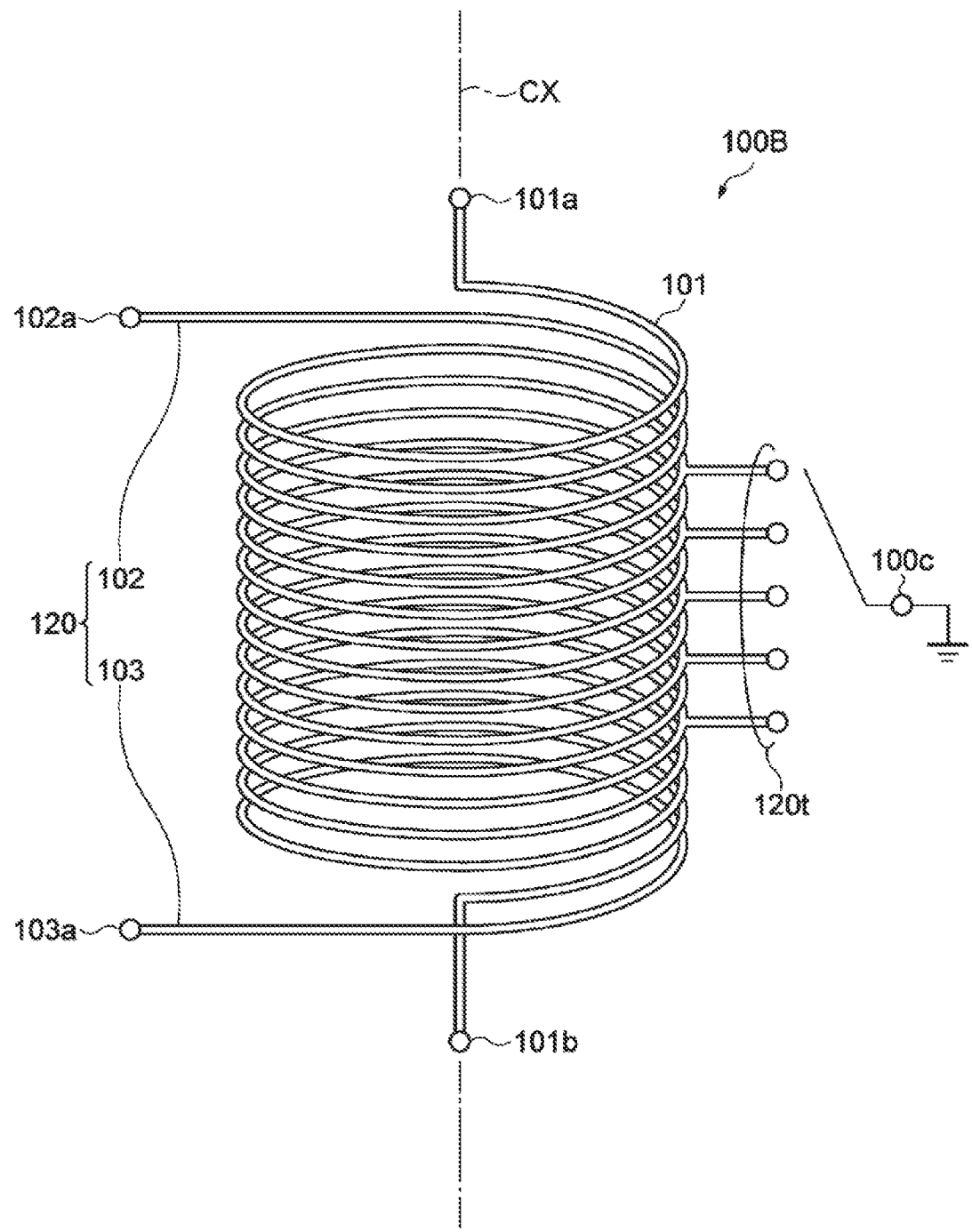
FIG. 2 is a diagram illustrating a transformer according to another embodiment.

FIG. 2 is a diagram illustrating a transformer according to another embodiment. Hereinafter, a difference between a transformer 100B illustrated in FIG. 2 and the transformer 100A will be described and redundant descriptions will be omitted. In the transformer 100B, a winding of the coil 120 has a plurality of taps 120t in the middle thereof. In the transformer 100B, a tap connected to a ground is selected from the taps 120t. Even in the transformer 100B, a self-inductance of each of a secondary coil 102 and a secondary coil 103 is smaller than that of a primary coil 101.

Figure 3:
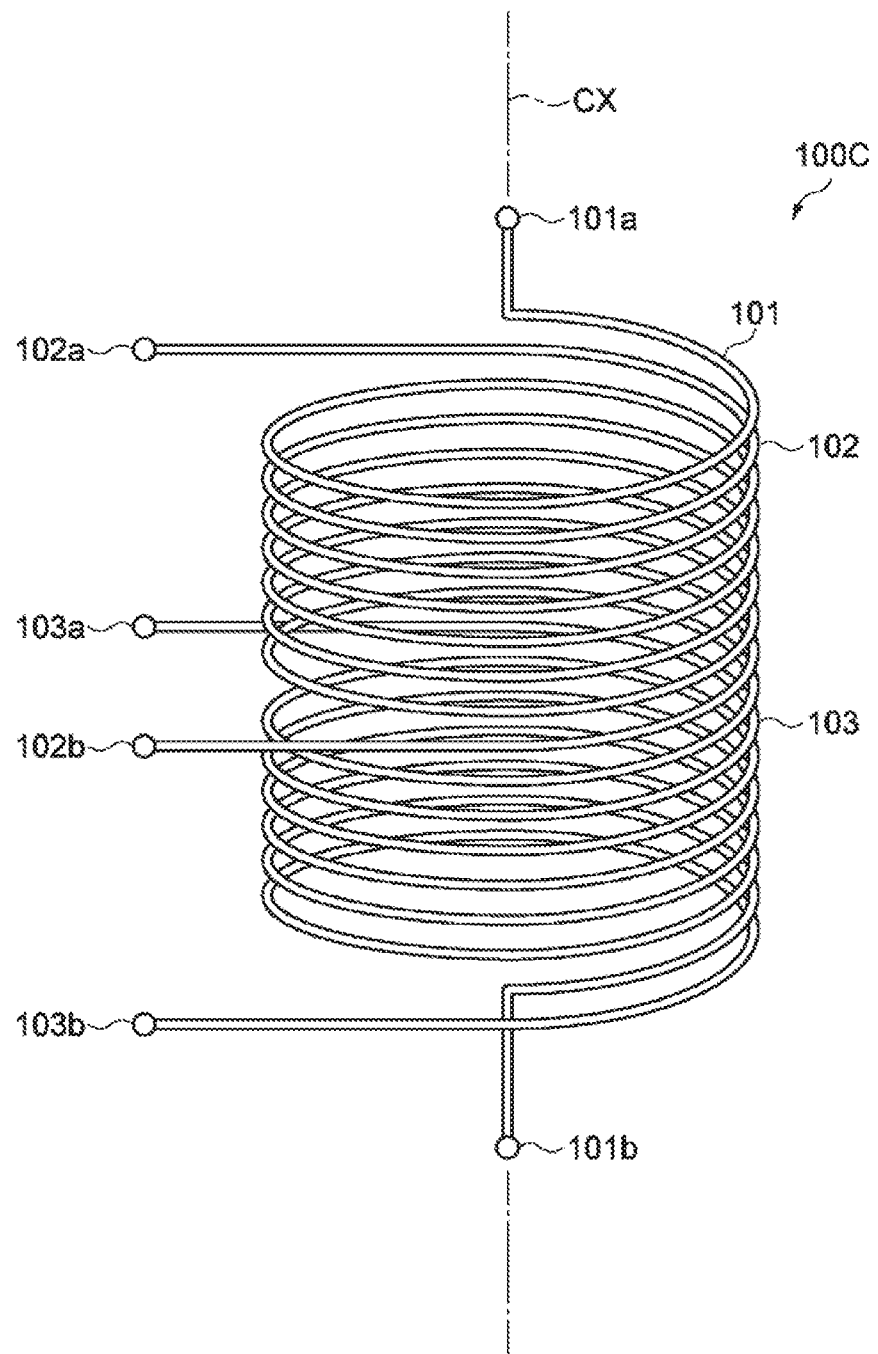
FIG. 3 is a diagram illustrating a transformer according to another embodiment.

FIG. 3 is a diagram illustrating a transformer according to still another embodiment. A transformer 100C illustrated in FIG. 3 has a primary coil 101 and two secondary coils 102 and 103. The primary coil 101 of the transformer 100C is similar to the primary coil 101 of the transformer 100A. In the transformer 100C, the secondary coil 102 and the secondary coil 103 are configured by separate windings. The secondary coil 102 and the secondary coil 103 are sequentially arranged along the central axis CX. A winding of the secondary coil 102 is spirally wound around the central axis CX in an alternate relationship with the winding of the primary coil 101. A winding of the secondary coil 103 is spirally wound around the central axis CX in an alternate relationship with the winding of the primary coil 101. Further, one end of the secondary coil 102 is a terminal 102a, and the other end of the secondary coil 102 is a terminal 102b. One end of the secondary coil 103 is a terminal 103a, and the other end of the secondary coil 103 is a terminal 103b.

Even in the transformer 100C, a self-inductance of each of the secondary coil 102 and the secondary coil 103 is smaller than that of the primary coil 101. Therefore, in an embodiment, the number of turns of each of the secondary coil 102 and the secondary coil 103 may be about half of the number of turns of the primary coil 101. Further, each of the secondary coil 102 and the secondary coil 103 may have substantially the same sectional area as that of the primary coil 101.

Figure 4:
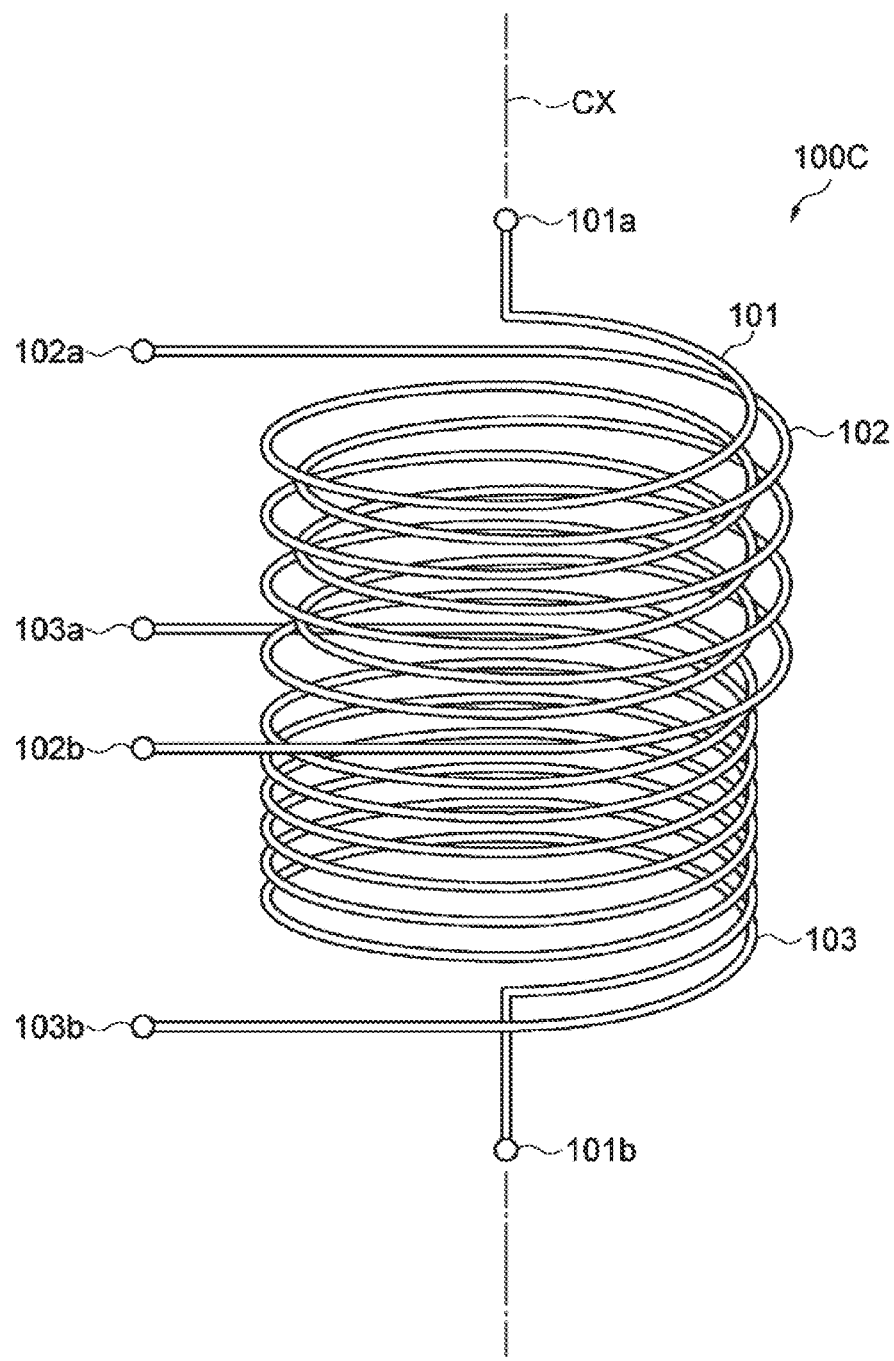
FIG. 4 is a diagram illustrating a movement of secondary coils of the transformer illustrated in FIG. 3.
Figure 5:
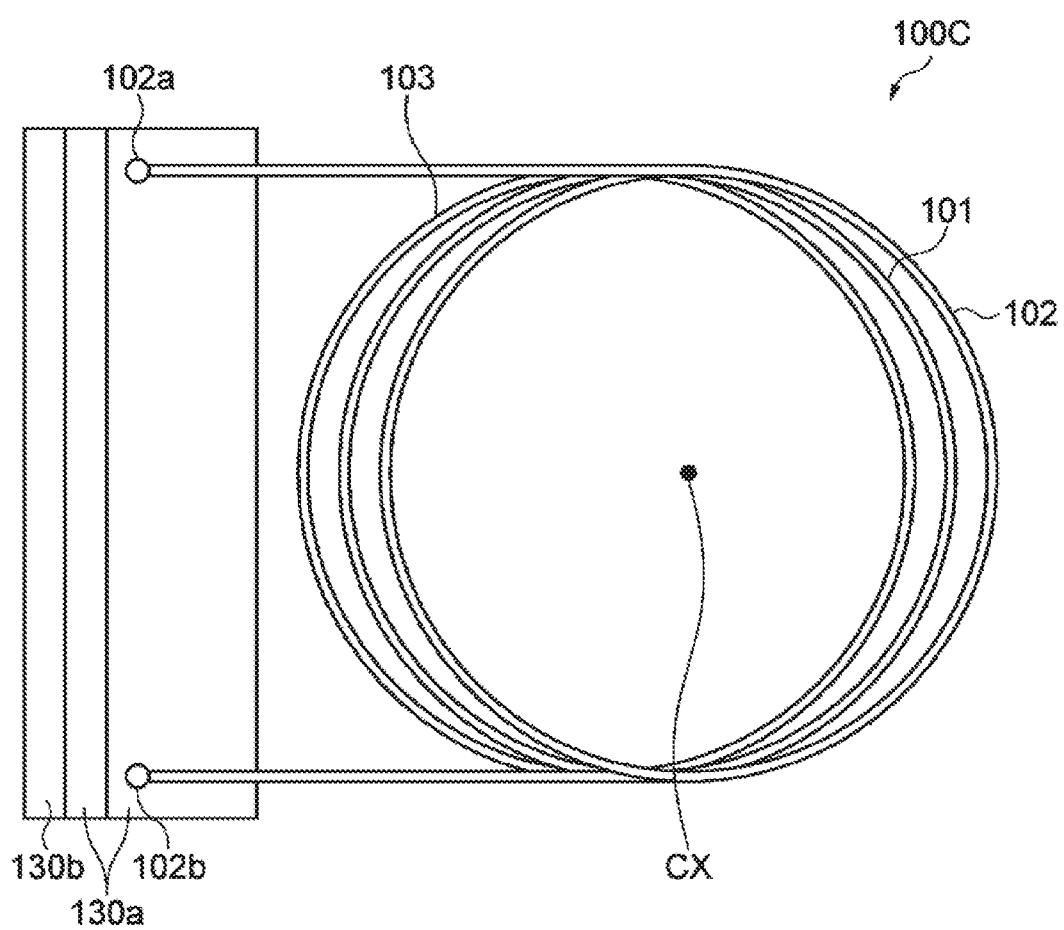
FIG. 5 is a plan view illustrating a movement of the secondary coils of the transformer illustrated in FIG. 3.

FIGS. 4 and 5 are diagrams illustrating a movement of the secondary coils 102 and 103 of the transformer 100C illustrated in FIG. 3. Further, FIG. 5 is a plan view of the transformer 100C when viewed in the direction of the central axis CX. As illustrated in FIGS. 4 and 5, the secondary coil 102 may be configured to be movable in a direction perpendicular to the central axis CX. The secondary coil 102 may be moved while being guided by a guide 130a. Further, as illustrated in FIG. 5, both the secondary coil 102 and the secondary coil 103 may be configured to be movable in the direction perpendicular to the central axis CX. The secondary coil 103 may be moved while being guided by a guide 130b. In the case where both the secondary coil 102 and the secondary coil 103 are movable, the secondary coil 102 and the secondary coil 103 may be moved in different directions such that the secondary coil 102 and the secondary coil 103 do not overlap with each other outside a region surrounded by the primary coil 101 when viewed in a direction in which the central axis CX extends. This makes it possible to suppress the interference between the secondary coils 102 and 103. In addition, one of the secondary coil 102 and the secondary coil 103 may be configured to be movable. When the secondary coils are movable in this way, it is possible to adjust a coupling factor of the primary coil 101 and the secondary coils 102 and 103.

Figure 6:
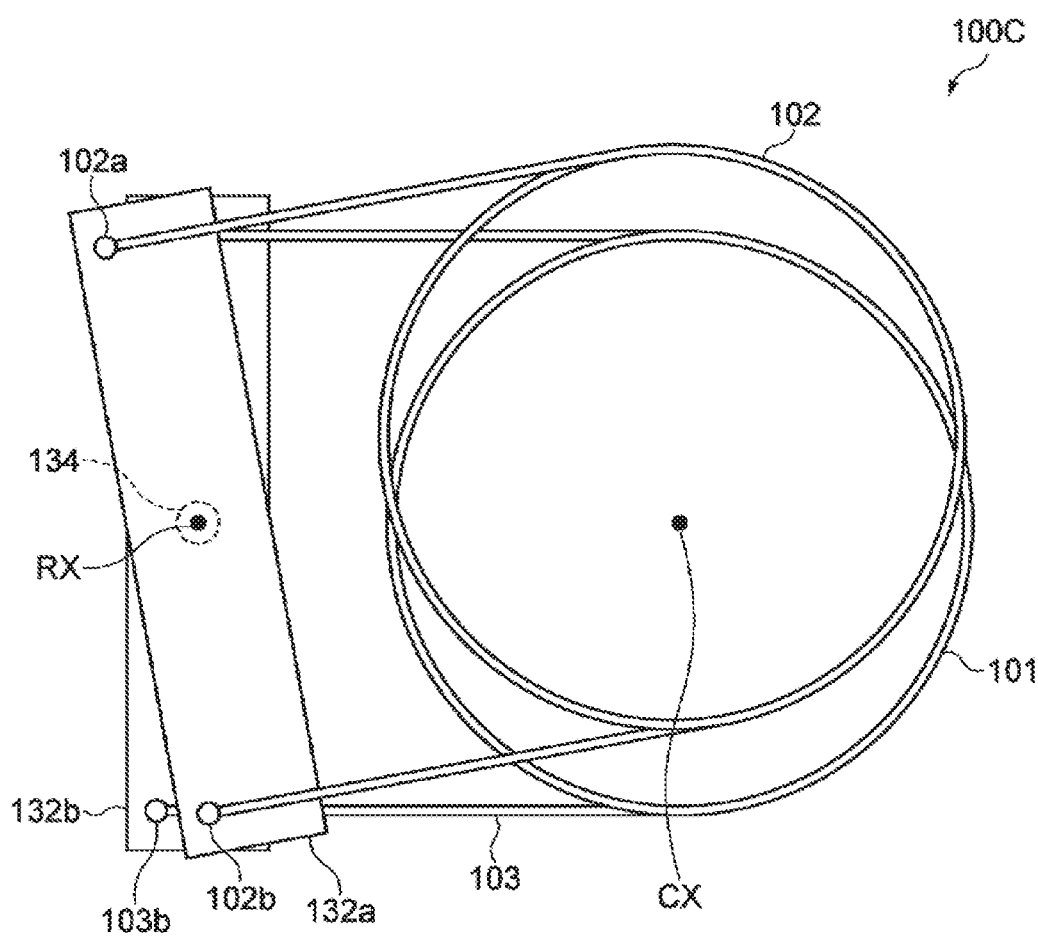
FIG. 6 is a diagram illustrating another movement of the secondary coils of the transformer illustrated in FIG. 3.

FIG. 6 is a diagram illustrating another movement of the secondary coils 102 and 103 of the transformer 103C illustrated in FIG. 3. FIG. 6 is a plan view of the transformer 100C when viewed in the direction of the central axis CX. As illustrated in FIG. 6, the secondary coil 102 may be configured to fluctuate around an axis RX. The axis RX extends in parallel to the central axis CX outside a region surrounded by the primary coil 101. In an embodiment, the secondary coil 102 is supported by a support 132a, which is pivotally supported by a shaft 134. A central axis line of the shaft 134 corresponds to the axis RX. In addition to the secondary coil 102, the secondary coil 103 may also be configured to fluctuate around the axis RX. In this case, the secondary coil 103 is supported by a support 132b, which is pivotally supported by the shaft 134. In addition, one of the secondary coil 102 and the secondary coil 103 may be configured to fluctuate. When the secondary coils 102 and 103 can fluctuate in this way, it is possible to adjust a coupling factor of the primary coil 101 and the secondary coils 102 and 103.

Figure 7:
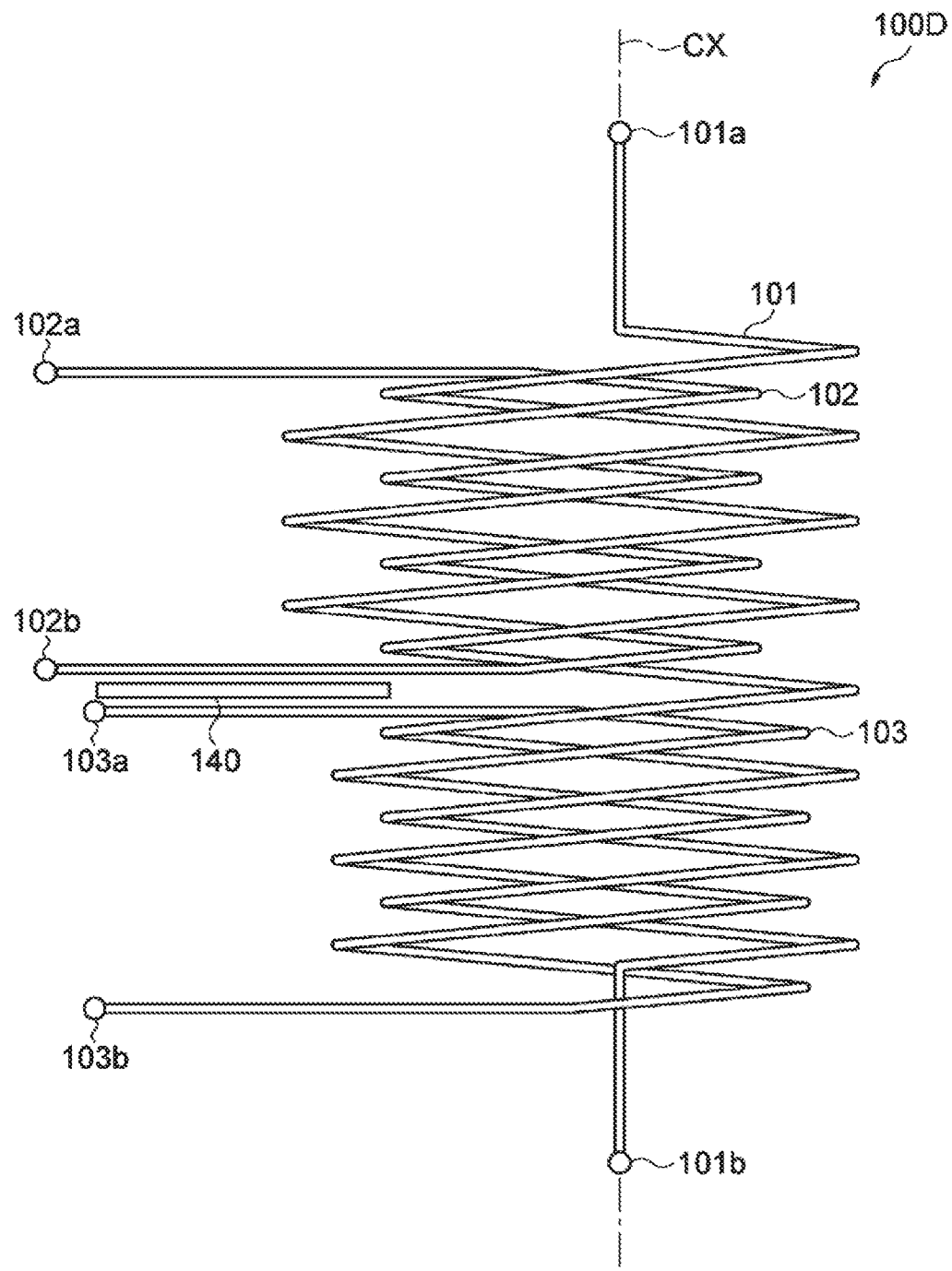
FIG. 7 is a diagram illustrating an exemplary modification of the transformer illustrated in FIG. 3.

FIG. 7 is a diagram illustrating a modification of the transformer 100C illustrated in FIG. 3. A plan view of a transformer 100D when viewed in a direction perpendicular to the central axis CX is illustrated in FIG. 7. The transformer 100D further includes a magnetic shield plate 140, in addition to the components of the transformer 100C. In a case where the secondary coil 102 and the secondary coil 103 overlap with each other outside a region surrounded by the primary coil 101 when viewed in a direction in which the central axis CX extends, interference occurs between the secondary coils 102 and 103. The magnetic shield plate 140 is disposed between the secondary coil 102 and the secondary coil 103 outside the region surrounded by the primary coil 101. This makes it possible to suppress the interference between the secondary coils 102 and 103. Further, the magnetic shield plate 140 may be formed of, for example, copper. The magnetic shield plate 140 may be grounded.

Figure 8:
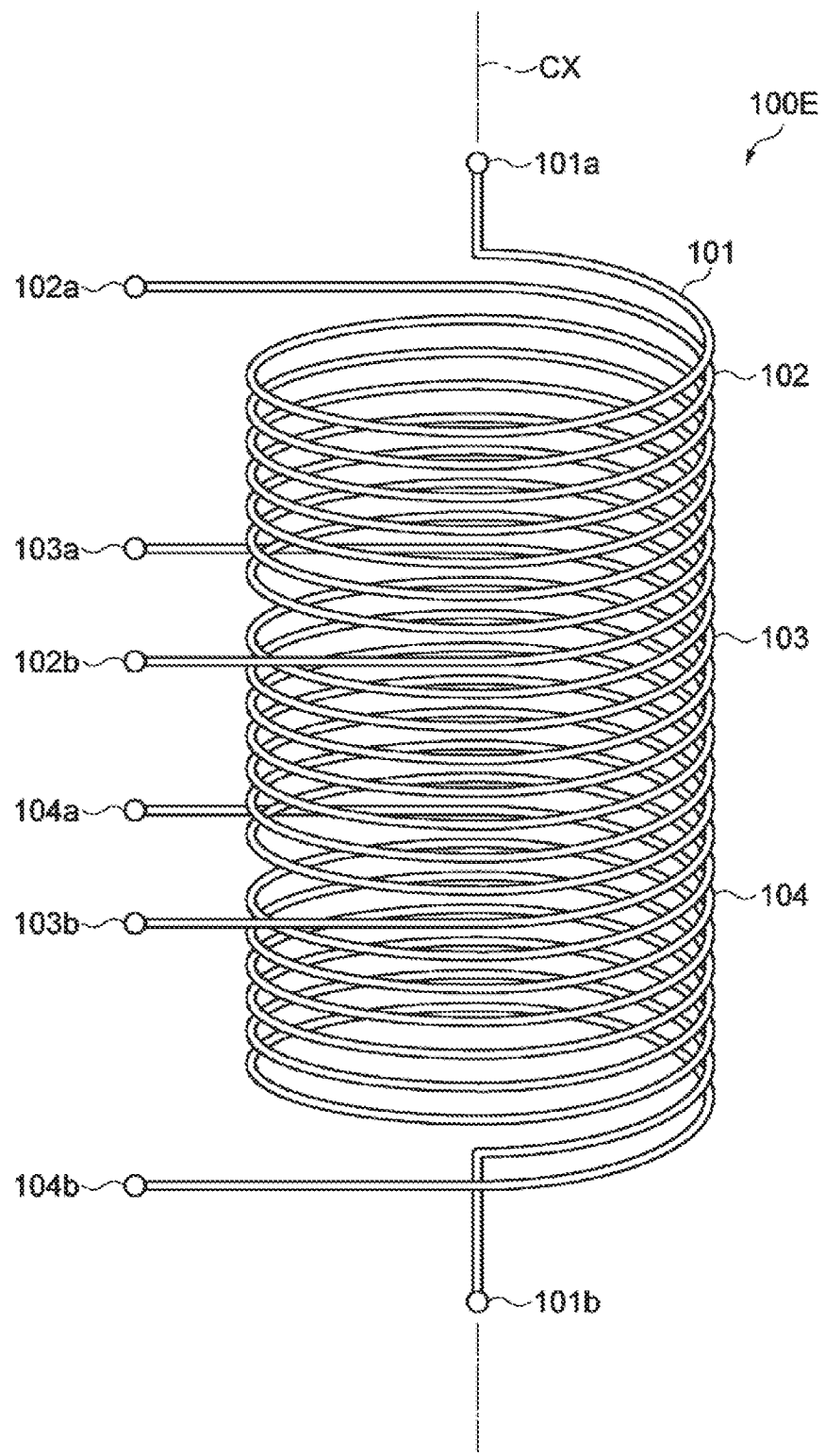
FIG. 8 is a diagram illustrating a transformer according to another embodiment.

FIG. 8 is a diagram illustrating a transformer according to still another embodiment. Hereinafter, a difference between a transformer 100E illustrated in FIG. 8 and the transformer 100C will be described and redundant descriptions will be omitted. The transformer 100E further includes a secondary coil 104, in addition to the primary coil 101 and the secondary coils 102 and 103. The secondary coil 104 is configured by a separate winding from the winding of the secondary coil 102 and the winding of the secondary coil 103. The secondary coil 102, the secondary coil 103, and the secondary coil 104 are sequentially arranged along the central axis CX. A winding of the secondary coil 104 is spirally wound around the central axis CX in an alternate relationship with the winding of the primary coil 101. Further, one end of the secondary coil 104 is a terminal 104a, and the other end of the secondary coil 104 is a terminal 104b.

In the transformer 100E, a self-inductance of each of the secondary coil 102, the secondary coil 103, and the secondary coil 104 is smaller than that of the primary coil 101. Therefore, in an embodiment, the number of turns of each of the secondary coil 102, the secondary coil 103, and the secondary coil 104 may be about ⅓ of the number of turns of the primary coil 101. Further, each of the secondary coil 102, the secondary coil 103, and the secondary coil 104 may have substantially the same sectional area as that of the primary coil 101.

In addition, the transformer 100E may further include one or more secondary coils similar to the secondary coil 102, the secondary coil 103, and the secondary coil 104. That is to say, the transformer 100E may include four or more secondary coils as a plurality of secondary coils. Further, at least one of the secondary coils of the transformer 100E may be movable like the secondary coils described above with reference to FIGS. 4 and 5. Also, in a case where at least two of the plurality of secondary coils are movable, at least these two secondary coils may be moved in different directions such that they do not overlap outside the region surrounded by the primary coil 101 when viewed in the direction in which the central axis CX extends. Alternatively, one or more magnetic shield plates may be installed between at least two secondary coils outside the region surrounded by the primary coil 101. In some embodiments, at least one of the plurality of secondary coils of the transformer 100E may fluctuate like the secondary coils described above with reference to FIG. 6.

Figure 9:
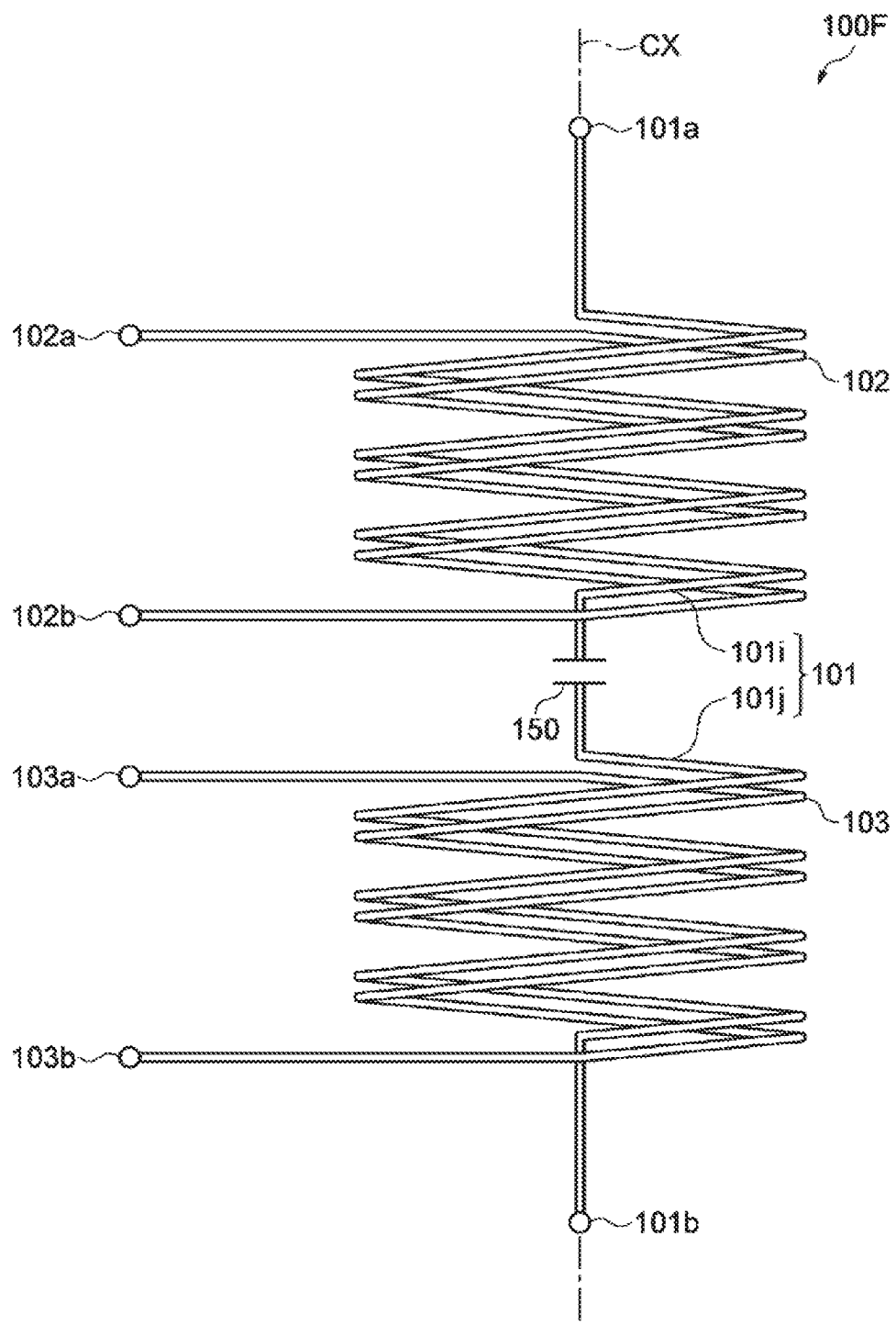
FIG. 9 is a diagram illustrating a transformer according to another embodiment.

FIG. 9 is a diagram illustrating a transformer according to still another embodiment. Hereinafter, a difference between a transformer 100F illustrated in FIG. 9 and the transformer 100C will be described and redundant descriptions will be omitted. In the transformer 100F, the primary coil 101 is composed of two coils 101i and 101j. Further, the transformer 100F further includes a condenser 150 (third condenser).

The coil 101i and the coil 101j are sequentially arranged along the central axis CX. A winding of the coil 101i is spirally wound around the central axis CX in an alternate relationship with the winding of the secondary coil 102. A winding of the coil 101j is spirally wound around the central axis CX in an alternate relationship with the winding of the secondary coil 103. One end of the coil 101i is a terminal 101a, and one end of the coil 101j is a terminal 101b. The condenser 150 is connected between the coil 101i and the coil 101j in a series relationship with the coil 101i and the coil 101j. Even in the transformer 100F, a self-inductance of each of the secondary coil 102 and the secondary coil 103 is smaller than that of the primary coil 101.

According to the transformer 100F, the impedance of the primary coil 101 is reduced by the condenser 150. Further, according to the condenser 150, a potential difference between a plurality of coils constituting the primary coil 101 is reduced.

Figure 10:
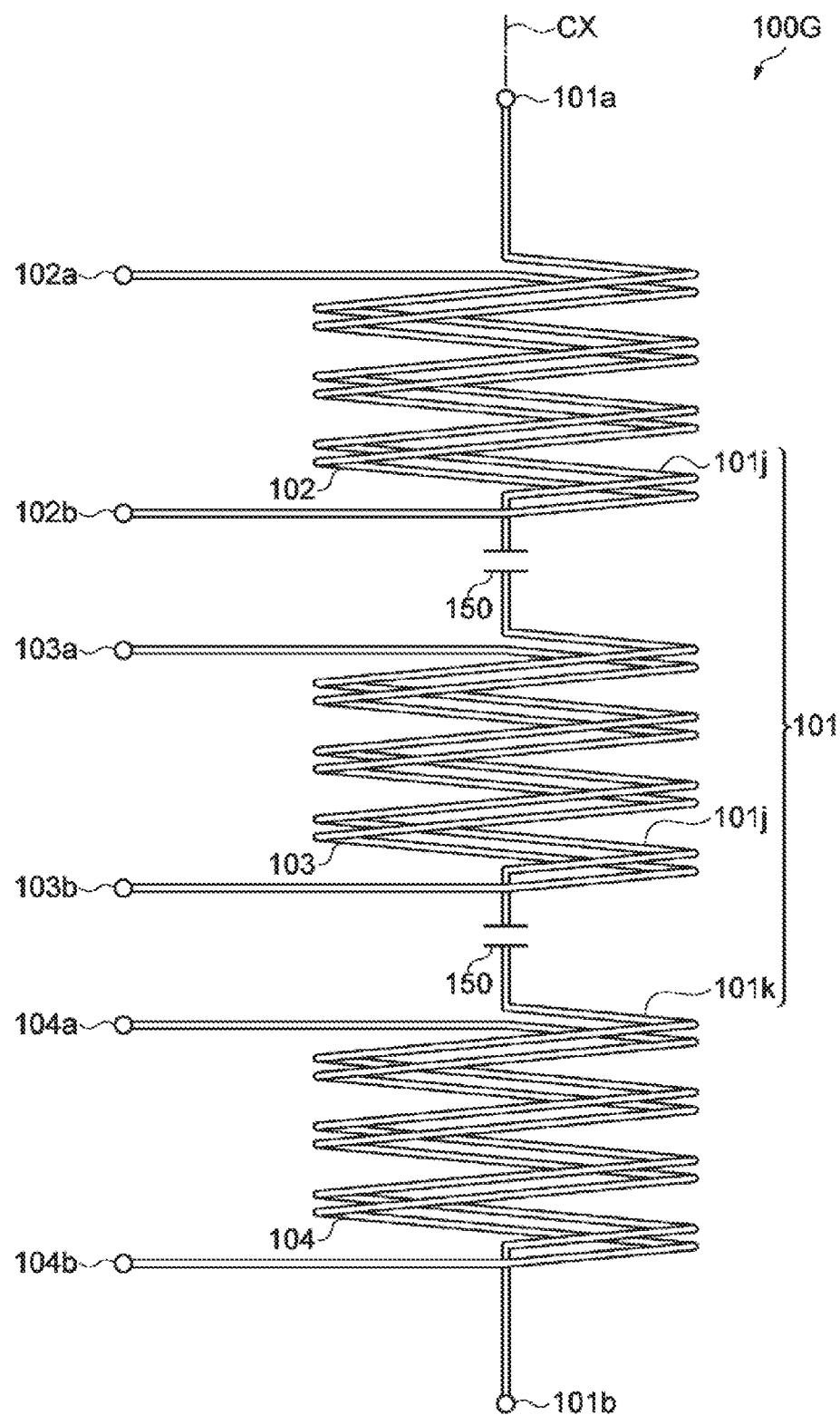
FIG. 10 is a diagram illustrating a transformer according to another embodiment.

FIG. 10 is a diagram illustrating a transformer according to still another embodiment. Hereinafter, a difference between a transformer 100G illustrated in FIG. 10 and the transformer 100E will be described and redundant descriptions will be omitted. In the transformer 100G, the primary coil 101 is composed of three coils 101*i*, 101*j* and 101*k*. Further, the transformer 100G further includes two condensers 150 (third condenser).

The coil 101*i*, the coil 101*j* and 101*k* are sequentially arranged along the central axis CX. A winding of the coil 101*i* is spirally wound around the central axis CX in an alternate relationship with the winding of the secondary coil 102. A winding of the coil 101*j* is spirally wound around the central axis CX in an alternate relationship with the winding of the secondary coil 103. A winding of the coil 101*k* is spirally wound around the central axis CX in an alternate relationship with the winding of the secondary coil 104. One end of the coil 101*i* is a terminal 101*a*, and one end of the coil 101*k* is a terminal 101*b*. The two condensers 150 and the plurality of coils 101*i*, 101*j* and 101*k* are alternately connected in a series relationship with each other. Even in this transformer 100G, a self-inductance of each of the secondary coil 102, the secondary coil 103 and the secondary coil 104 is smaller than that of the primary coil 101.

Further, similar to the transformer 100E, the transformer 100G may include four or more secondary coils as a plurality of secondary coils. In this case, the primary coil 101 includes four or more coils as a plurality of coils. In addition, the transformer 100G may include three or more condensers which are alternately connected in a series relationship with the four or more coils of the primary coil 101, as a plurality of condensers 150.

Figure 11:
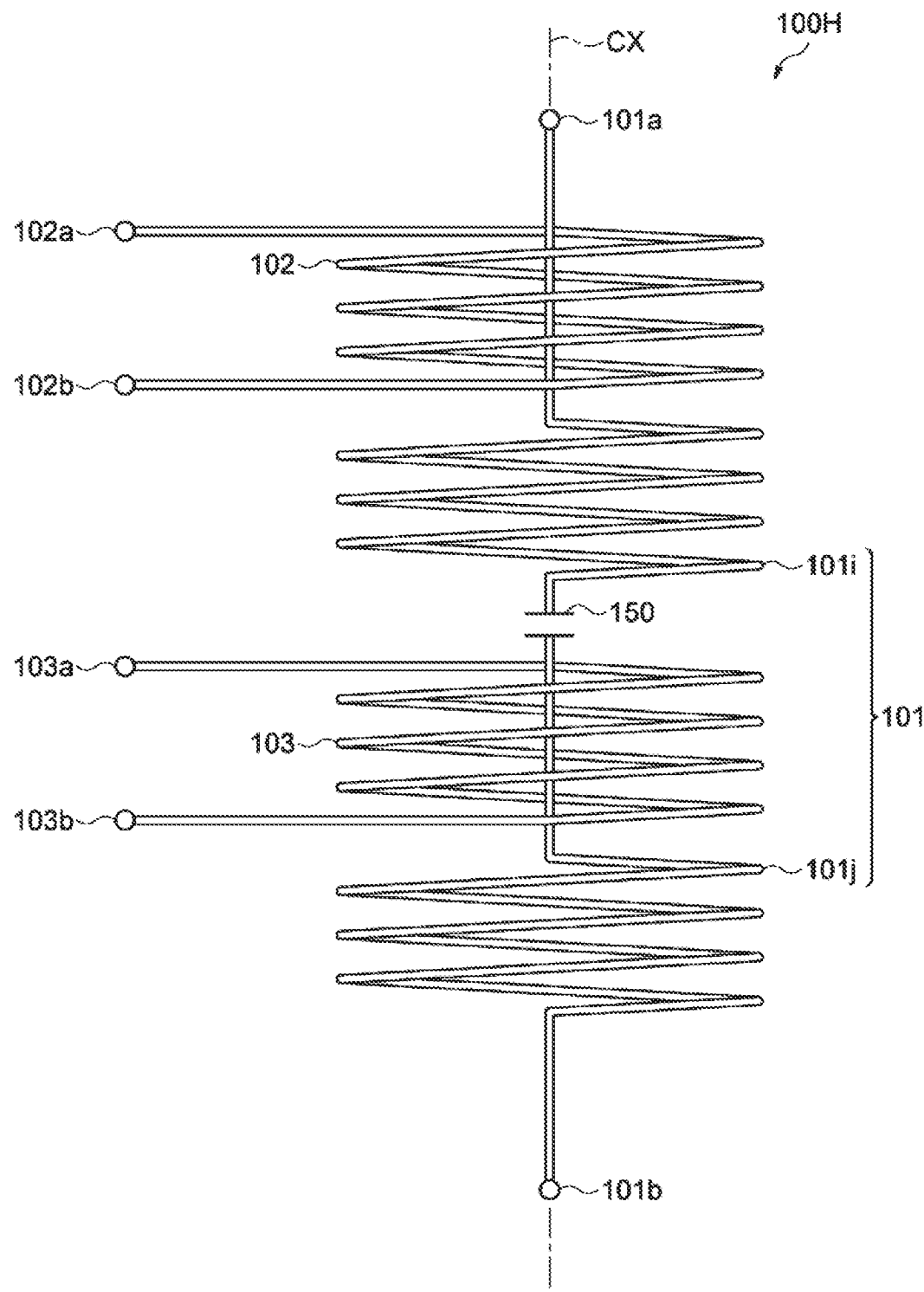
FIG. 11 is a diagram illustrating a transformer according to another embodiment.

FIG. 11 is a diagram illustrating a transformer regarding another embodiment. Hereinafter, a difference between a transformer 100H illustrated in FIG. 11 and the transformer 100F will be described and redundant descriptions will be omitted. In the transformer 100H, a winding of the coil 101*i* and a winding of the secondary coil 102 are not alternately wound, and a winding of the coil 101*j* and a winding of the secondary coil 103 are also not alternately wound. In the transformer 100H, the secondary coil 102, the coil 101*i*, the secondary coil 103, and the coil 101*j* are sequentially arranged along the direction in which the central axis CX extends.

Further, the transformer 100H may include three or more secondary coils as a plurality of secondary coils. In this case, the primary coil 101 includes three or more coils as a plurality of coils. The plurality of coils of the primary coil 101 and the plurality of secondary coils are alternately arranged along the direction in which the central axis CX extends. Further, the transformer 100H may include two or more condensers 150 as a plurality of condensers which are alternately connected in a series relationship with the plurality of coils of the primary coil.

Figure 12:
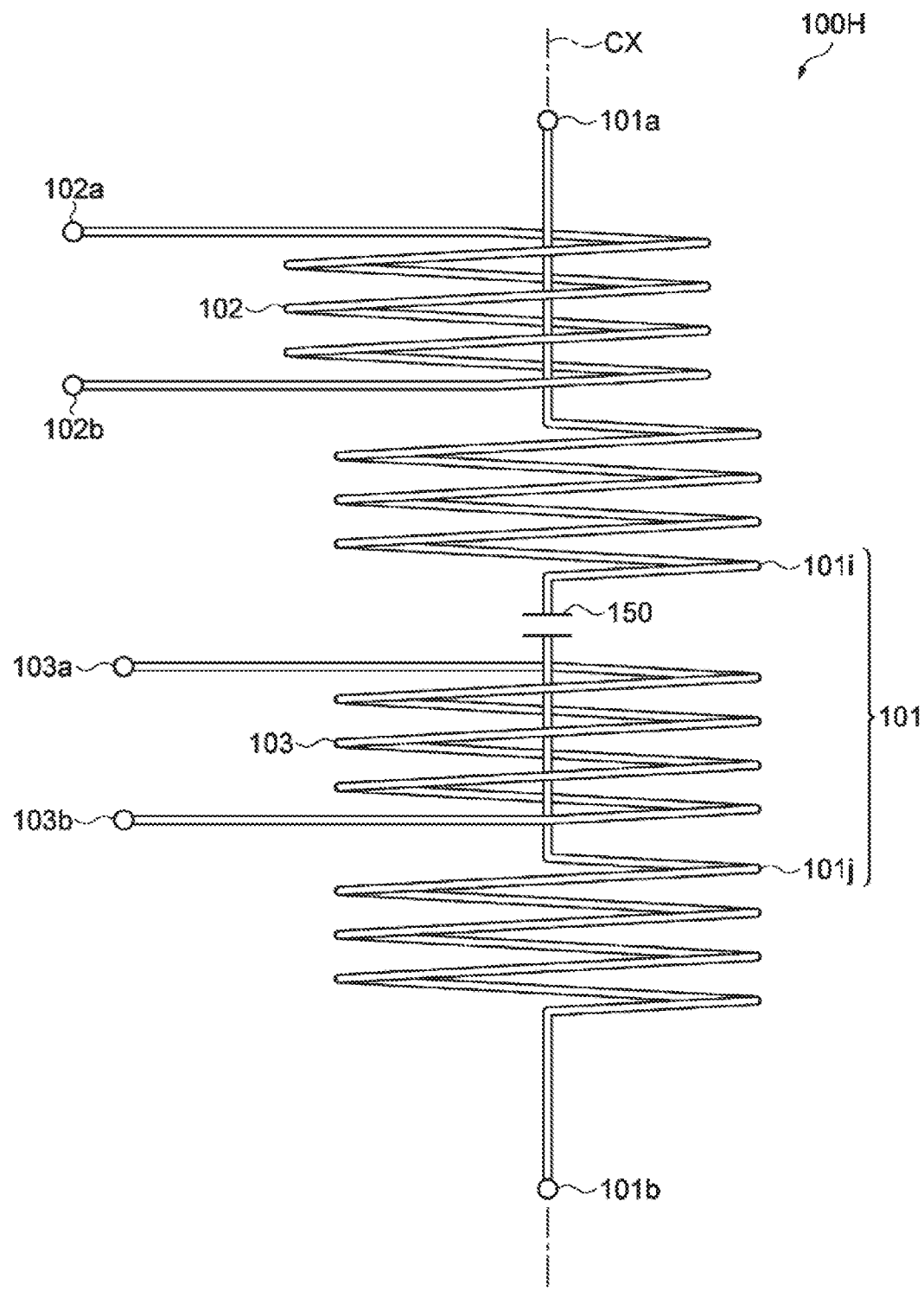
FIG. 12 is a diagram illustrating a movement of secondary coils of the transformer illustrated in FIG. 11.

FIG. 12 is a diagram illustrating a movement of the secondary coils of the transformer illustrated in FIG. 11. As illustrated in FIG. 12, at least one of the plurality of secondary coils of the transformer 100H may be movable like the secondary coils described above with reference to FIGS. 4 and 5. Further, in the case where at least two of the plurality of secondary coils of the transformer 100H are movable, at least these two secondary coils may be moved in different directions such that they do not overlap outside a region surrounded by the primary coil 101 when viewed in the direction in which the central axis CX extends. Alternatively, one or more magnetic shield plates may be installed between at least two secondary coils outside the region surrounded by the primary coil 101. Further, at least one of the plurality of secondary coils of the transformer 100H may fluctuate like the secondary coils described above with reference to FIG. 6.

Figure 13:
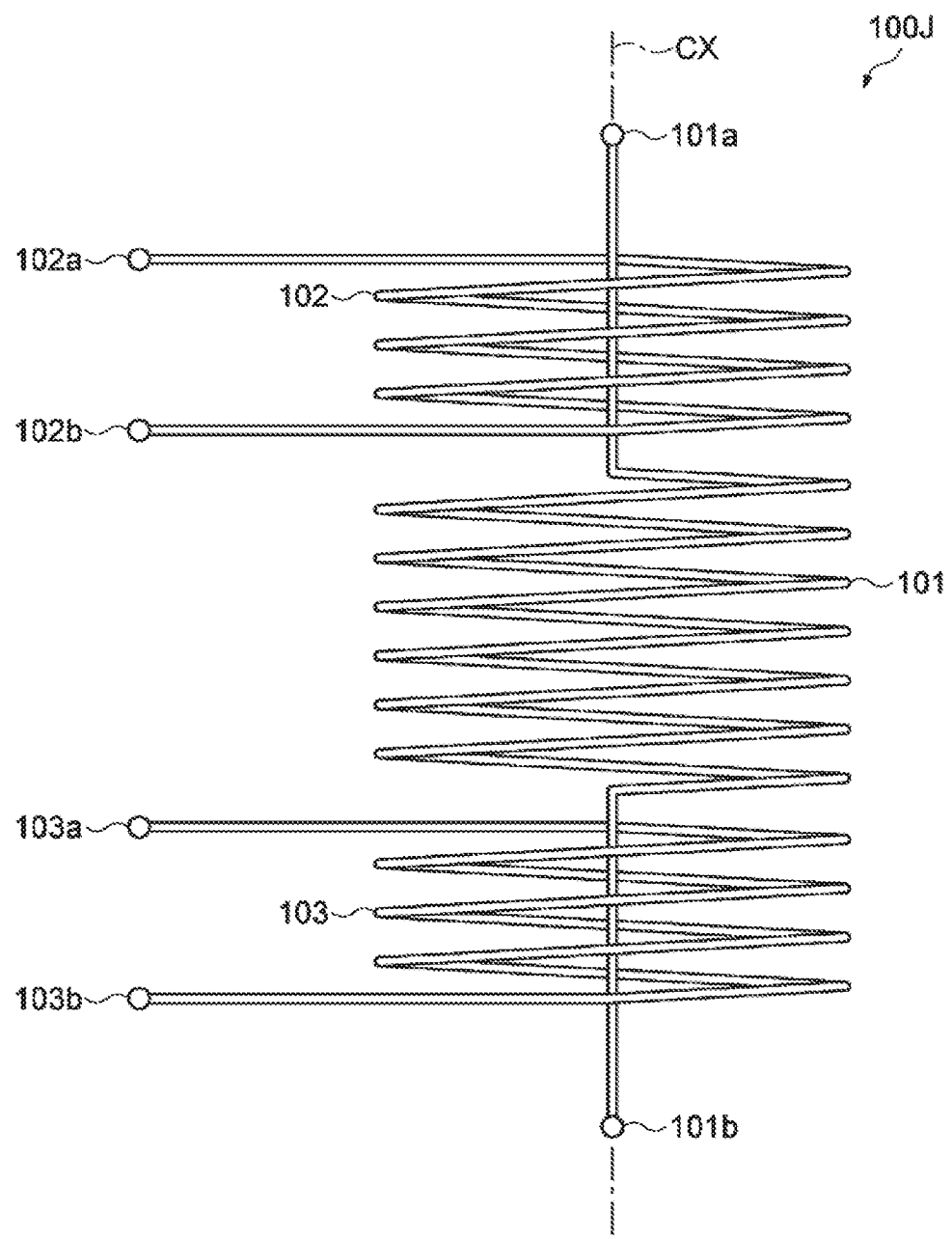
FIG. 13 is a diagram illustrating a transformer according to another embodiment.

FIG. 13 is a diagram illustrating a transformer according to still another embodiment. Hereinafter, a difference between a transformer 100J illustrated in FIG. 13 and the transformer 100C will be described and redundant descriptions will be omitted. In the transformer 100J, the secondary coil 102 is disposed at one side with respect to the center of the primary coil 101 in the direction in which the central axis CX extends. Further, the secondary coil 103 is disposed at the other side with respect to the center of the primary coil 101 in the direction in which the central axis CX extends. Even in this transformer 100J, a self-inductance of each of the secondary coil 102 and the secondary coil 103 is smaller than that of the primary coil 101. Further, in an example illustrated in FIG. 13, a winding of the primary coil 101 and a winding of the secondary coil 102 are not alternately wound, and a winding of the primary coil 101 and a winding of the secondary coil 103 are also not alternately wound. That is to say, the secondary coil 102 is disposed at one side of the primary coil 101 in the direction in which the central axis CX extends. Further, the secondary coil 103 is disposed at the other side of the primary coil 101 in the direction in which the central axis CX extends. However, when the secondary coil 102 is disposed at one side with respect to the center of the primary coil 101 in the direction in which the central axis CX extends, a portion of the winding of the secondary coil 102 may be wound in an alternate relationship with the winding of the primary coil 101. Further, when the secondary coil 103 is disposed at the other side with respect to the center of the primary coil 101 in the direction in which the central axis CX extends, a portion of the winding of the secondary coil 103 may be wound in an alternate relationship with the winding of the primary coil 101.

Figure 14:
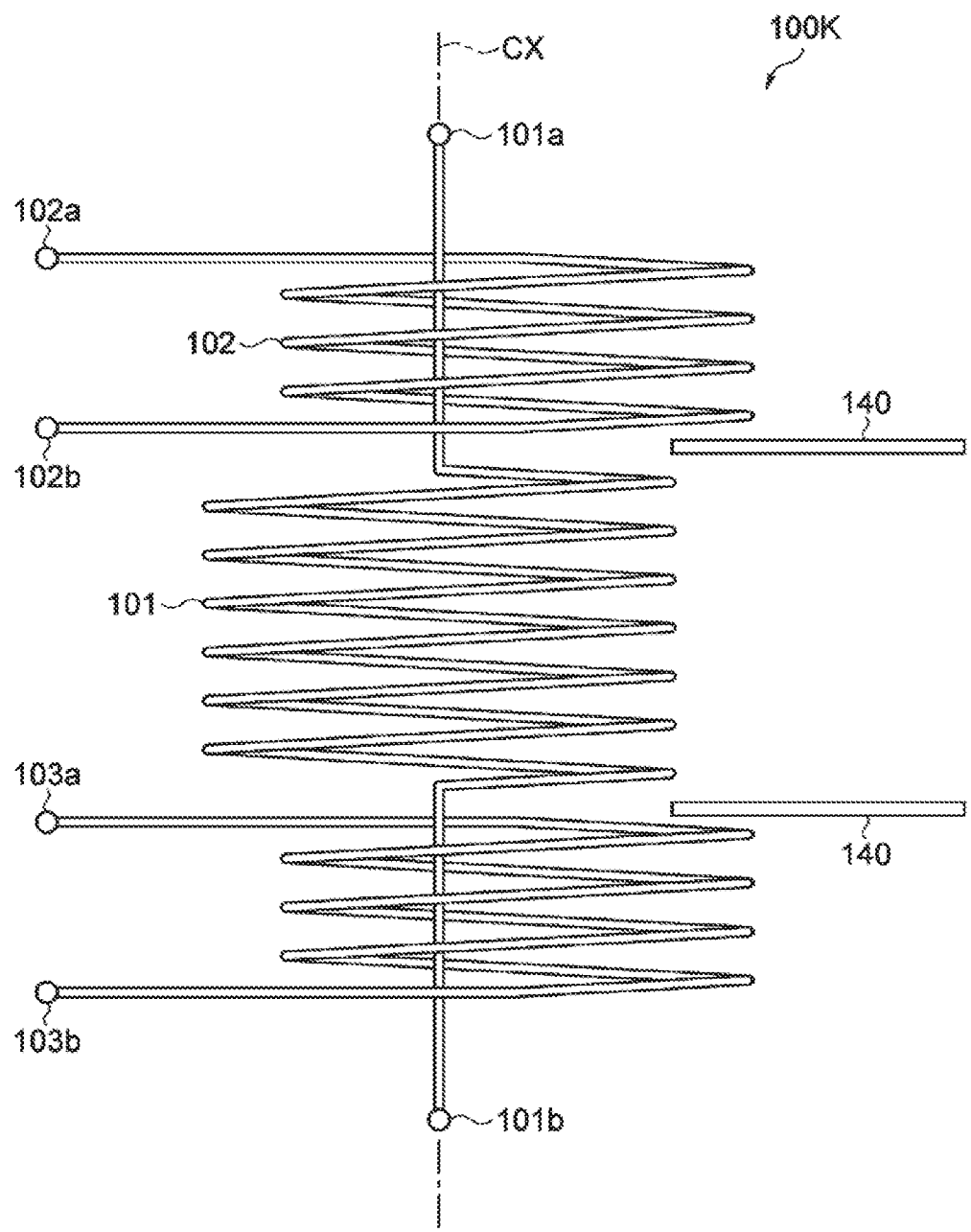
FIG. 14 is a diagram illustrating an exemplary modification of the transformer illustrated in FIG. 13.

FIG. 14 is a diagram illustrating a modification of the transformer illustrated in FIG. 13. In a transformer 100K illustrated in FIG. 14, the secondary coil 102 and the secondary coil 103 are configured to be movable in the direction perpendicular to the central axis CX, like the secondary coils described above with reference to FIGS. 4 and 5. Further, in order to suppress the interference between the secondary coils outside a region surrounded by the primary coil 101, two magnetic shield plates 140 are installed. One of the two magnetic shield plates 140 is installed between the secondary coil 102 and the secondary coil 103 and near the secondary coil 102 outside the region surrounded by the primary coil 101. The other of the two magnetic shield plates 140 is installed between the secondary coil 102 and the secondary coil 103 and near the secondary coil 103 outside the region surrounded by the primary coil 101.

Figure 15:
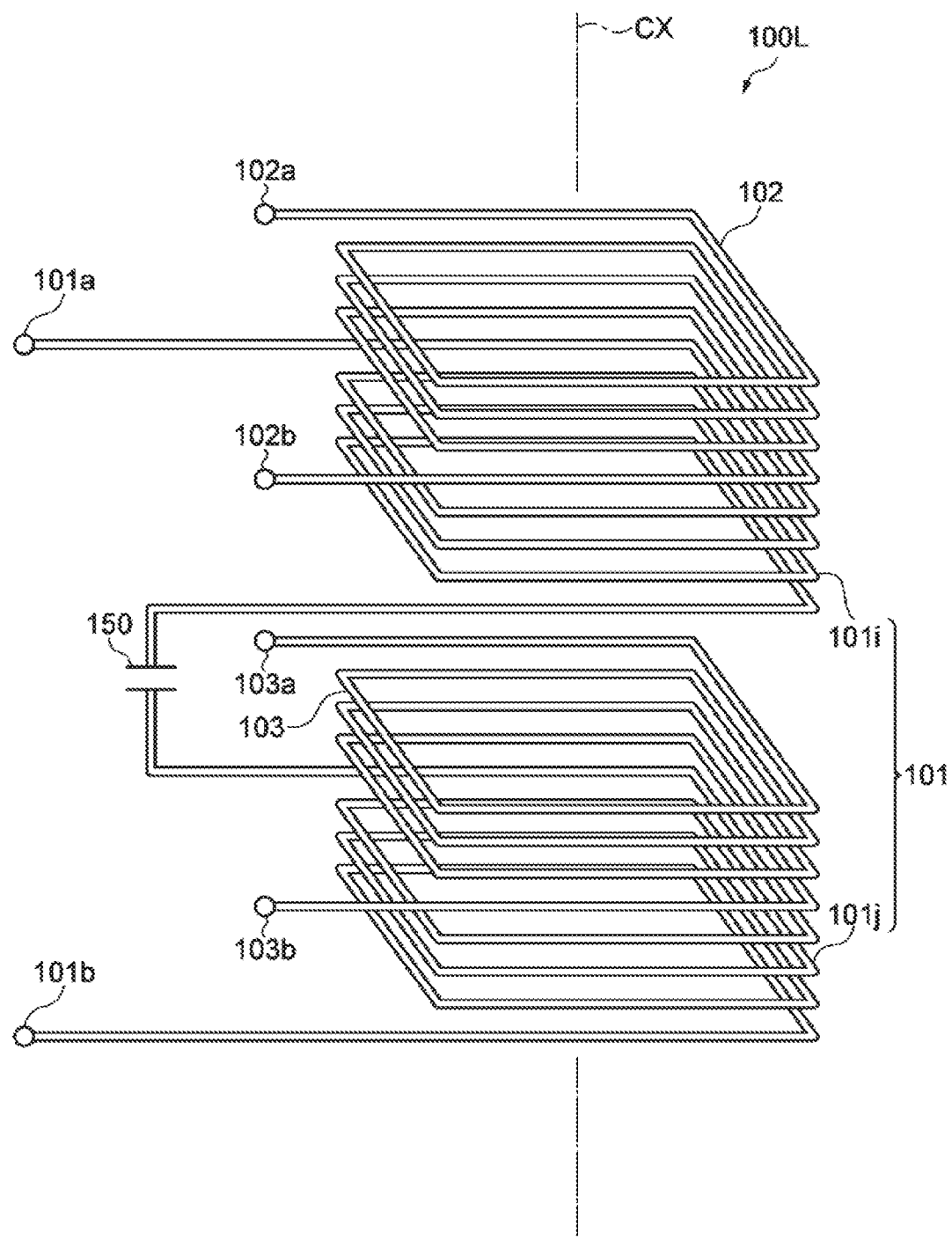
FIG. 15 is a diagram illustrating a transformer according to another embodiment.

FIG. 15 is a diagram illustrating a transformer according to still another embodiment. Hereinafter, a difference between a transformer 100L illustrated in FIG. 15 and the transformer 100H will be described and redundant descriptions will be omitted. In the transformer 100L, each of the coil 101*i*, the coil 101*j*, the secondary coil 102, and the secondary coil 103 is a rectangular coil.

The transformer 100L may further include one or more secondary coils similar to the secondary coil 102 and the secondary coil 103. That is to say, the transformer 100L may include three or more coils as a plurality of secondary coils. In this case, the primary coil 101 includes three or more coils as a plurality of coils. Further, the transformer 100L may include two or more condensers which are alternately connected in a series relationship with the plurality of coils of the primary coil 101, as a plurality of condensers 150.

Figure 16:
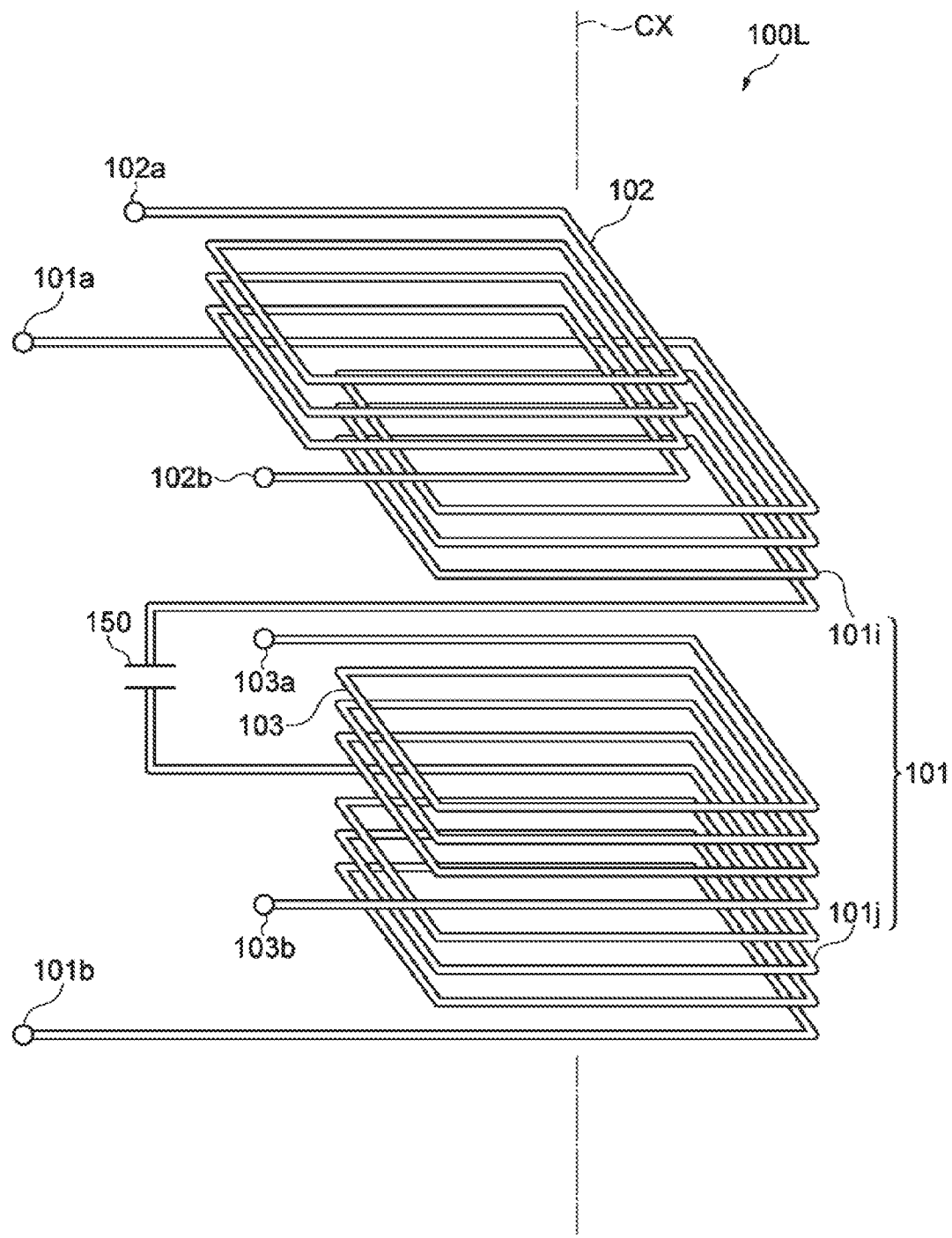
FIG. 16 is a diagram illustrating a movement of secondary coils of a transformer illustrated in FIG. 15.

FIG. 16 is a diagram illustrating a movement of the secondary coils of the transformer illustrated in FIG. 15. As illustrated in FIG. 16, at least one of the plurality of secondary coils of the transformer 100L may be movable like the secondary coils described above with reference to FIGS. 4 and 5. Further, in the case where at least two of the plurality of secondary coils of the transformer 100L are movable, at least these two secondary coils may be moved in different directions such that they do not overlap outside the region surrounded by the primary coil 101 when viewed in the direction in which the central axis CX extends. Alternatively, one or more magnetic shield plates may be installed between at least two secondary coils outside the region surrounded by the primary coil 101. In some embodiments, at least one of the plurality of secondary coils of the transformer 100L may fluctuate like the secondary coils described above with reference to FIG. 6.

Figure 17:
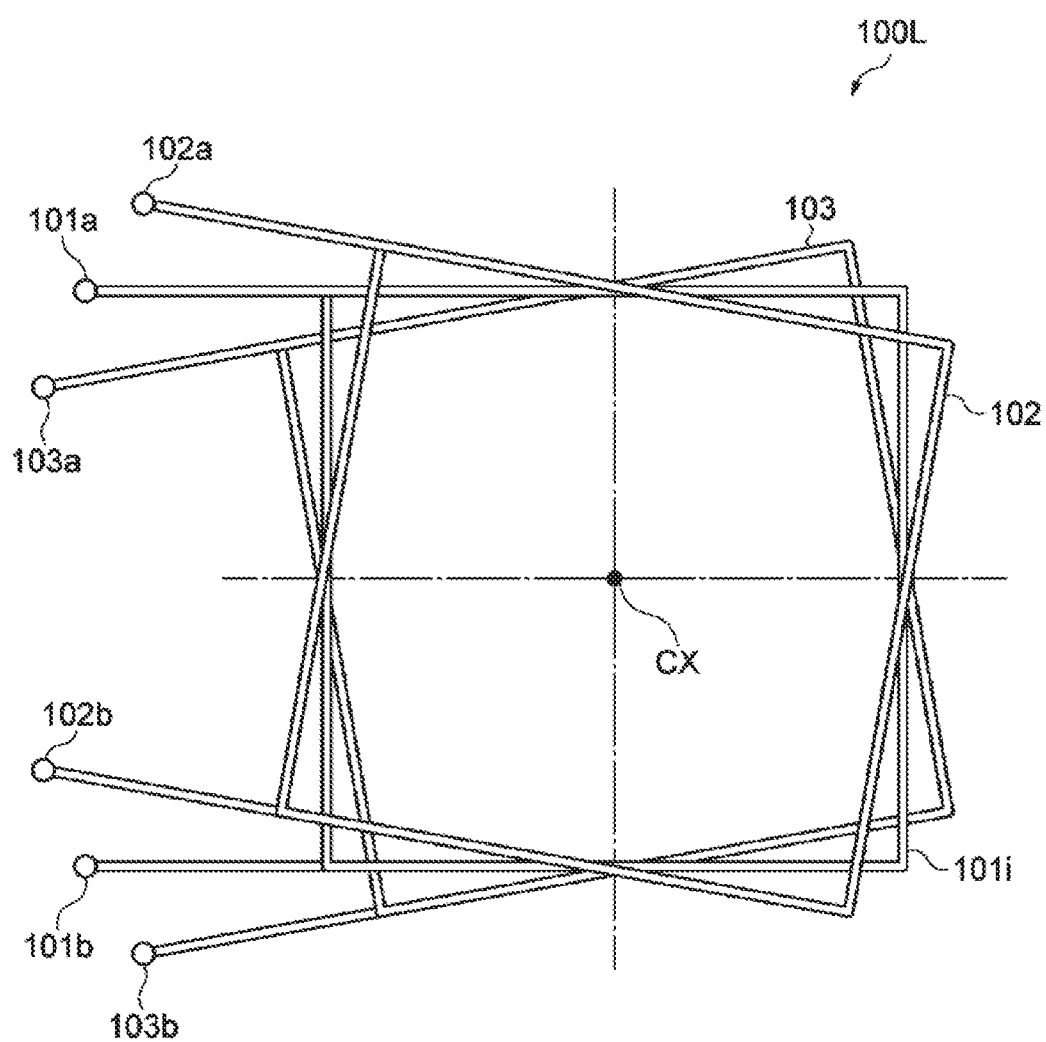
FIG. 17 is a diagram illustrating another movement of the secondary coils of the transformer illustrated in FIG. 15.

FIG. 17 is a diagram illustrating another movement of the secondary coils of the transformer illustrated in FIG. 15. As illustrated in FIG. 17, at least one of the plurality of secondary coils of the transformer 100L may be configured to be rotatable around the central axis CX.

In some embodiments, the plurality of secondary coils of each of the transformers 100A, 100B, 100C, 100D, 100E, 100F, 100G, 100H, 100J, and 100K may also be rectangular coils, like the primary coil and the secondary coils of the transformer 100L.

Figure 18:
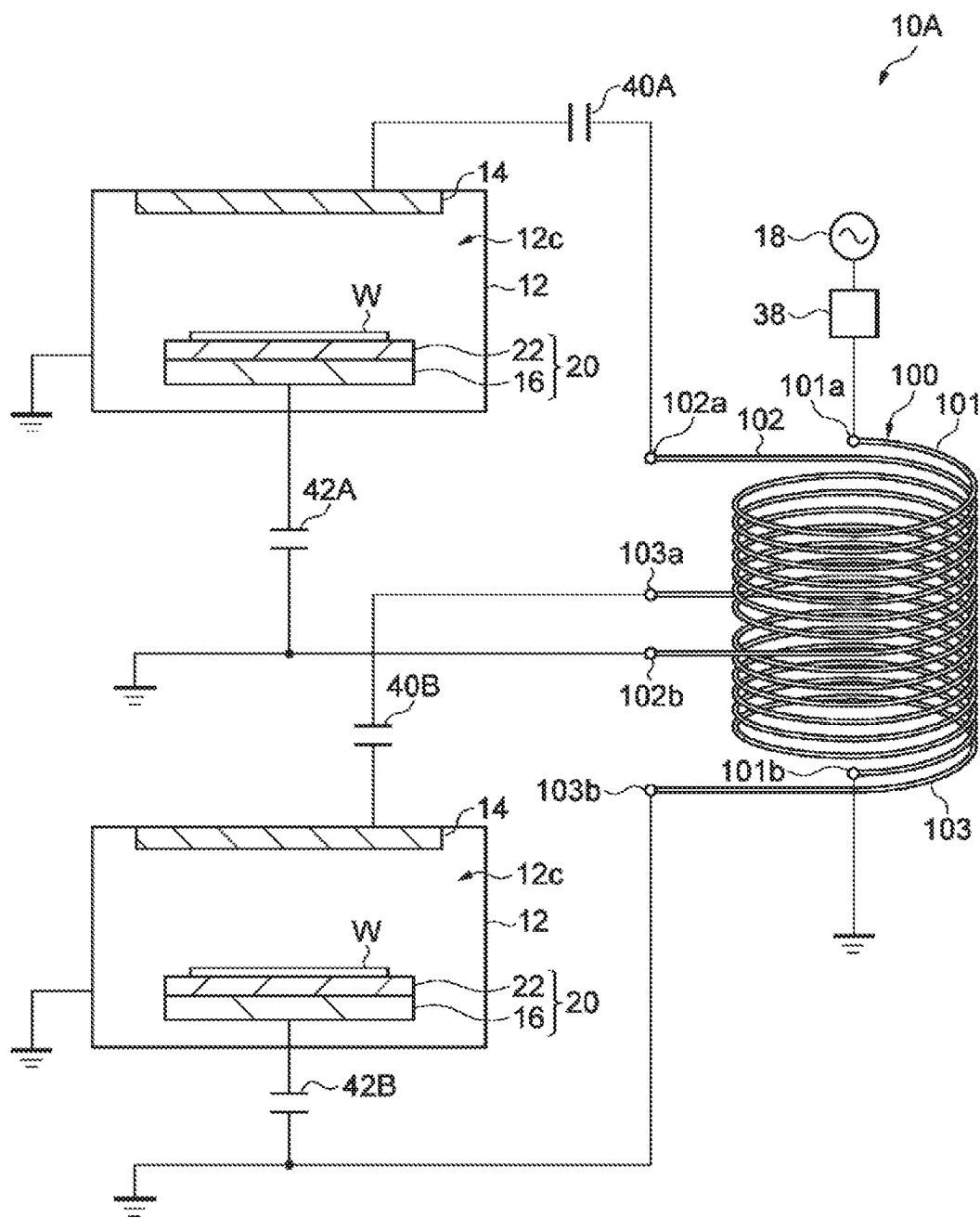
FIG. 18 is a diagram illustrating a plasma processing apparatus according to an embodiment of the present disclosure.

Hereinafter, various embodiments of a plasma processing apparatus will be described. FIG. 18 is a diagram illustrating a plasma processing apparatus according to an embodiment of the present disclosure. A plasma processing apparatus 10A illustrated in FIG. 18 is a capacitively-coupled plasma processing apparatus. The plasma processing apparatus 10A includes two chamber bodies 12, two upper electrodes 14, two lower electrodes 16, a high frequency power supply 18, a transformer 100, two first condensers 40A and 40B (first condenser), and two second condensers 42A and 42B (second condenser).

Each of the two chamber bodies 12 provides its internal space as a chamber 12c. The two chambers 12c respectively provided by the two chamber bodies 12 are separated from each other. The two upper electrodes 14 are respectively installed in upper spaces within the two chambers 12c. The two lower electrodes 16 are respectively installed in lower spaces within the two chambers 12c.

Hereinafter, the chamber body 12 and its internal configuration, and components connected to the chamber body 12 will be described in detail. Further, since the internal configurations of the two chamber bodies 12 are the same, only one chamber body 12 will be described hereinbelow.

Figure 19:
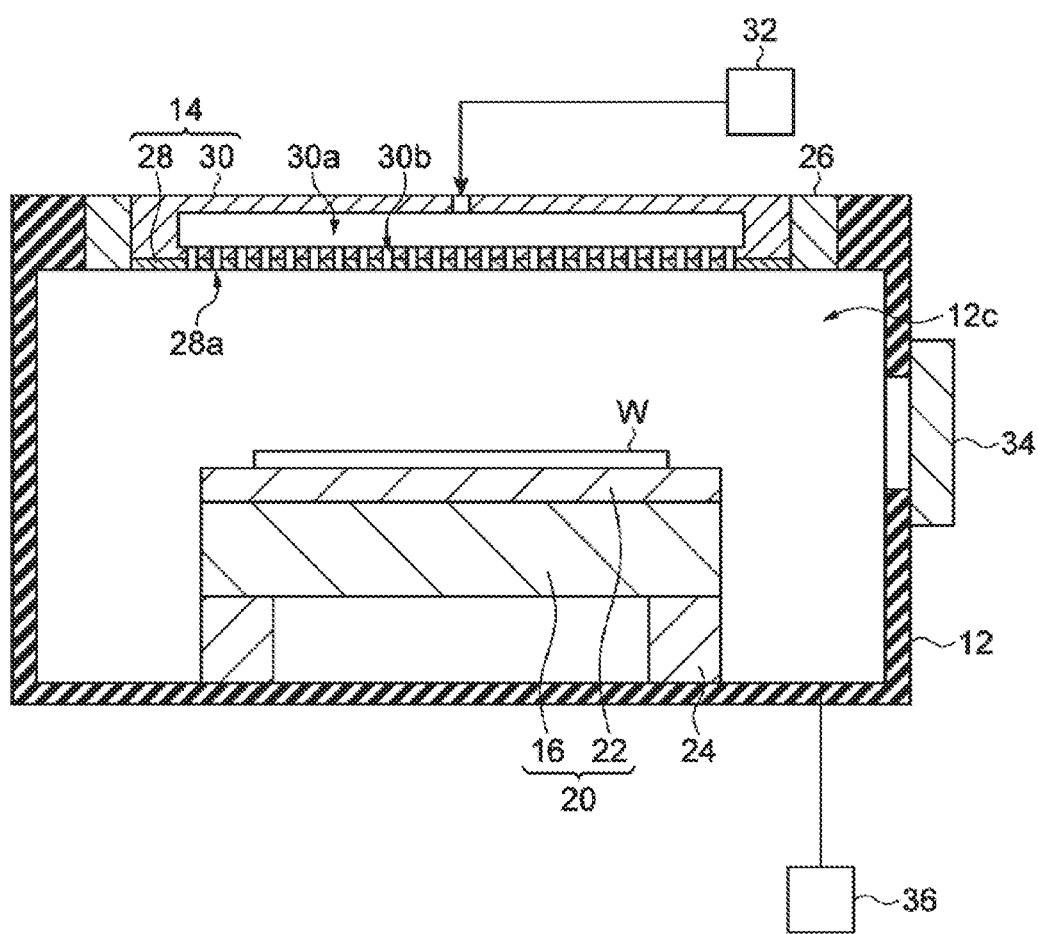
FIG. 19 is a diagram illustrating a configuration of a chamber body.

FIG. 19 is a diagram illustrating a configuration of the chamber body 12. As described above, the internal space of the chamber body 12 is provided as the chamber 12c. The chamber body 12 is formed of metal such as aluminum. A plasma-resistant coating is formed on an inner wall surface of the chamber body 12. The plasma-resistant coating may be a ceramic film such as an alumite film or an yttrium oxide film. The chamber body 12 has a substantially cylindrical sidewall portion, a bottom portion continuous with a lower end of the sidewall portion, and an upper end portion continuous with an upper end of the sidewall portion. The chamber body 12 is grounded.

A stage 20 is installed inside the chamber body 12. The stage 20 includes a lower electrode 16. Further, in an embodiment, the stage 20 further includes an electrostatic chuck 22. The stage 20 is supported by an insulating support 24 extending from the bottom portion of the chamber body 12. The lower electrode 16 has a substantially disc shape and is formed of a conductor such as aluminum. The electrostatic chuck 22 is installed on the lower electrode 16. The electrostatic chuck 22 includes a dielectric film and an electrode embedded in the dielectric film. A power supply is connected to the electrode of the electrostatic chuck 22 via a switch. As a voltage is applied to the electrode of the electrostatic chuck 22 from the power supply, the electrostatic chuck 22 generates an electrostatic force. The electrostatic chuck 22 adsorbs a workpiece W mounted thereon and supports the workpiece W by virtue of the electrostatic force.

The upper end portion of the chamber body 12 is opened. The upper electrode 14 is supported by the upper end portion of the chamber body 12 with an insulating member 26 interposed therebetween. The upper electrode 14 closes the opening of the upper end portion of the chamber body 12 together with the member 26. A space is defined between the upper electrode 14 and the lower electrode 16 in the chamber 12c. The upper electrode 14 includes a ceiling plate 28 and a support 30. The ceiling plate 28 is arranged to face the chamber 12c. The ceiling plate 28 may be formed of a material such as silicon, aluminum, or quartz. Further, when the ceiling plate 28 is formed of aluminum, a plasma-resistant coating is formed on a surface of the ceiling plate 28. A plurality of gas discharge holes 28a is formed in the ceiling plate 28.

The support 30 detachably supports the ceiling plate 28. The support 30 is formed of, for example, a conductor such as aluminum. A gas diffusion chamber 30a is formed within the support 30. A plurality of holes 30b for connecting the gas diffusion chamber 30a and the gas discharge holes 28a is formed in the support 30. Further, a gas supply part 32 for supplying a plasma process gas is connected to the gas diffusion chamber 30a. The gas supply part 32 includes a plurality of gas sources, a plurality of flow rate controllers such as mass flow controllers, and a plurality of valves. Each of the plurality of gas sources is coupled to the gas diffusion chamber 30a via a respective flow rate controller among the plurality of flow rate controllers and a respective valve among the plurality of valves. This gas supply part 32 adjusts a flow rate of a gas supplied from a respective gas source selected from among the plurality of gas sources, and supplies the same to the gas diffusion chamber 30a. The gas supplied to the gas diffusion chamber 30a is supplied to the chamber 12c through the gas discharge holes 28a.

An opening through which a workpiece is transferred, is formed in a sidewall portion of the chamber body 12. This opening is configured to be opened and closed by a gate valve 34. In addition, an exhaust device 36 is connected to the chamber 12c. An internal pressure of the chamber 12c is reduced by the exhaust device 36.

Referring back to FIG. 18, as illustrated in FIG. 18, the terminal 101a of the transformer 100 is coupled to the high frequency power supply 18 via a matcher 38. The high frequency power supply 18 generates a high frequency, which is supplied to the primary coil 101 of the transformer 100. The matcher 38 includes a matching circuit for matching output impedance of the high frequency power supply 18 and impedance of a load side. The terminal 101b of the transformer 100 is grounded.

The terminal 102a of the transformer 100 is coupled to a first upper electrode via the first condenser 40A. The first upper electrode is one of the two upper electrodes 14 and is installed in an upper space within a first chamber among the two chambers 12c. The terminal 102b of the transformer 100 is connected to a first lower electrode via the second condenser 42A. The first lower electrode is one of the two lower electrodes 16 and is installed in a lower space within the first chamber. One end of the second condenser 42A is connected to the first lower electrode, and the other end of the second condenser 42A is grounded. By the second condenser 42A, an electric potential of the first lower electrode is separated from a ground electric potential in a direct current manner. Further, the first condenser 40A and the second condenser 42A are fixed condensers.

The terminal 103a of the transformer 100 is coupled to a second upper electrode via the first condenser 40B. The second upper electrode is the other of the two upper electrodes 14 and is installed in an upper space within a second chamber among the two chambers 12c. The terminal 103b of the transformer 100 is coupled to a second lower electrode via the second condenser 42B. The second lower electrode is the other of the two lower electrodes 16 and is installed in a lower space within the second chamber. One end of the second condenser 42B is connected to the second lower electrode, and the other end of the second condenser 42B is grounded. By the second condenser 42b, an electric potential of the second lower electrode is separated from a ground electric potential in a direct current manner. Further, the first condenser 40B and the second condenser 42B are fixed condensers.

In the plasma processing apparatus 10A, any one of the aforementioned transformers 100A, 100B, 100C, 100D, 100F, 100H, 100J, 100K, and 100L may be used as the transformer 100. Further, when the transformer 100A or the transformer 100B is used as the transformer 100, the terminal 100c is coupled to the first lower electrode via the second condenser 42A and coupled to the second lower electrode via the second condenser 42B.

Here, in a case where a high frequency power supply is connected to a primary coil and a load of complex impedance $Z_2$ is connected to a secondary coil, a ratio (current ratio) of a current value $I_1$ of the primary coil and a current value $I_2$ of the secondary coil is expressed by Eq. (1) below. In Eq. (1), $L_1$ denotes a self-inductance of the primary coil, $L_2$ denotes a self-inductance of the secondary coil, k denotes a coupling factor between the primary coil and the secondary coil, and Ω denotes an angular frequency of high frequency.

$$\frac{I_2}{I_1} = \frac{ik\sqrt{L_1 L_2}\,\omega}{Z_2 + iL_2\omega} \approx k\sqrt{\frac{L_1}{L_2}} \quad \text{Eq. (1)}$$

In Eq. (1), in order to increase the current ratio without relying on the complex impedance $Z_2$ of the load, it is necessary to set the size or the number of turns of the secondary coil such that the relationship of $Z_2 \ll L_2\omega$ is satisfied. Thus, as each of the plurality of secondary coils of the transformer of the plasma processing apparatus according to various embodiments, a coil having inductance greater than the impedance of a load connected to the respective coil may be used.

When the secondary coil satisfies the relationship of $Z_2 \ll L_2\omega$, as expressed in Eq. (1), the current ratio is approximately a product of the coupling factor (k) and a square root of a ratio of the self-inductance $L_1$ and the self-inductance $L_2$. As can be seen from Eq. (1), it is possible to further increase the current ratio by setting the self-inductance $L_2$ of the secondary coil to become smaller than the self-inductance $L_1$ of the primary coil. Further, it is possible to increase the current ratio by increasing the coupling factor k. In addition, the coupling factor k is 1, which is a maximum value, when the sectional areas of the primary coil and the secondary coil are equal and the primary coil and the secondary coil completely overlap each other when viewed in the direction of the central axis CX. Thus, it is possible to further increase the current ratio by setting the sectional areas of the primary coil and the secondary coil to become substantially equal to each other.

In the transformer used in the plasma processing apparatus 10A, the self-inductance of each of the plurality of secondary coils is smaller than the inductance of the primary coil. Thus, a ratio of a current value of the secondary coil to a current value of the primary coil, i.e., a current ratio, is large. Accordingly, in the plasma processing apparatus 10A, the efficiency of power supply to the electrodes for the chambers 12c is high. Further, in the transformer used in the plasma processing apparatus 10A, it is possible to coaxially dispose the primary coil and the plurality of secondary coils. Thus, it is possible to increase the coupling factor between the primary coil and each of the plurality of secondary coils. Accordingly, in the plasma processing apparatus 10A, the efficiency of power supply to the electrodes for the chambers 12c is further increased. In addition, by setting the sectional area of the primary coil and the sectional area of the plurality of secondary coils to become substantially equal to each other, it is possible to further increase the current ratio, thereby further enhancing the efficiency of power supply to the electrodes for the chambers 12c.

Figure 20:
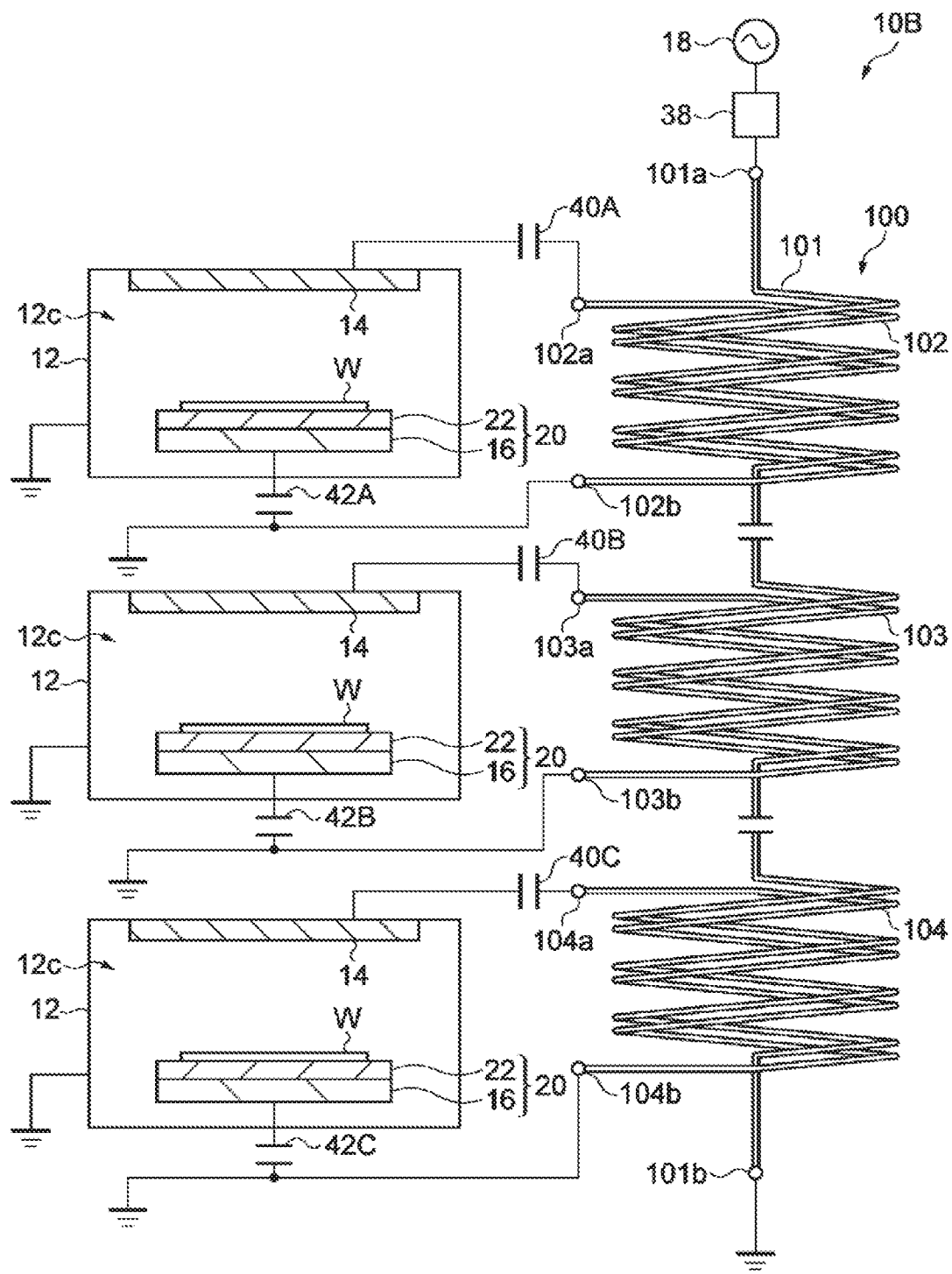
FIG. 20 is a diagram illustrating a plasma processing apparatus according to another embodiment.

FIG. 20 is a diagram illustrating a plasma processing apparatus according to another embodiment. Hereinafter, a difference between a plasma processing apparatus 10B illustrated in FIG. 20 and the plasma processing apparatus 10A will be described and redundant descriptions will be omitted.

As illustrated in FIG. 20, the plasma processing apparatus 10B includes three chamber bodies 12, three upper electrodes 14, three lower electrodes 16, three first condensers 40A, 40B, and 40C, and three second condensers 42A, 42B, and 42C. That is to say, the plasma processing apparatus 10B additionally includes one chamber body 12, one upper electrode 14, one lower electrode 16, one first condenser 40C, and one second condenser 42C, in addition to the components of the plasma processing apparatus 10A.

A terminal 104a of the transformer 100 is coupled to a third upper electrode via the first condenser 40C. The third upper electrode is another electrode among the three upper electrodes 14 and is installed in an upper space within a third chamber among the three chambers 12c. A terminal 104b of the transformer 100 is coupled to a third lower electrode via the second condenser 42C. The third lower electrode is another electrode among the three lower electrodes 16 and is installed in a lower space within the third chamber. One end of the second condenser 42C is connected to the third lower electrode, and the other end of the second condenser 42C is grounded. By the second condenser 42C, an electric potential of the third lower electrode is separated from a ground electric potential in a direct current manner. Further, the first condenser 40C and the second condenser 42C are fixed condensers.

In the plasma processing apparatus 10B, any one of the aforementioned transformers 100E, 100G, 100H, and 100L may be used as the transformer 100. Each of the transformer 100H and the transformer 100L, when used in the plasma processing apparatus 10B, includes three secondary coils. Further, the number of each of the chambers, the upper electrodes, the lower electrodes, the first condensers and the second condensers in the plasma processing apparatus may be an arbitrary number of four or more, respectively. The transformer may have secondary coils corresponding to the number of the chambers.

Figure 21:
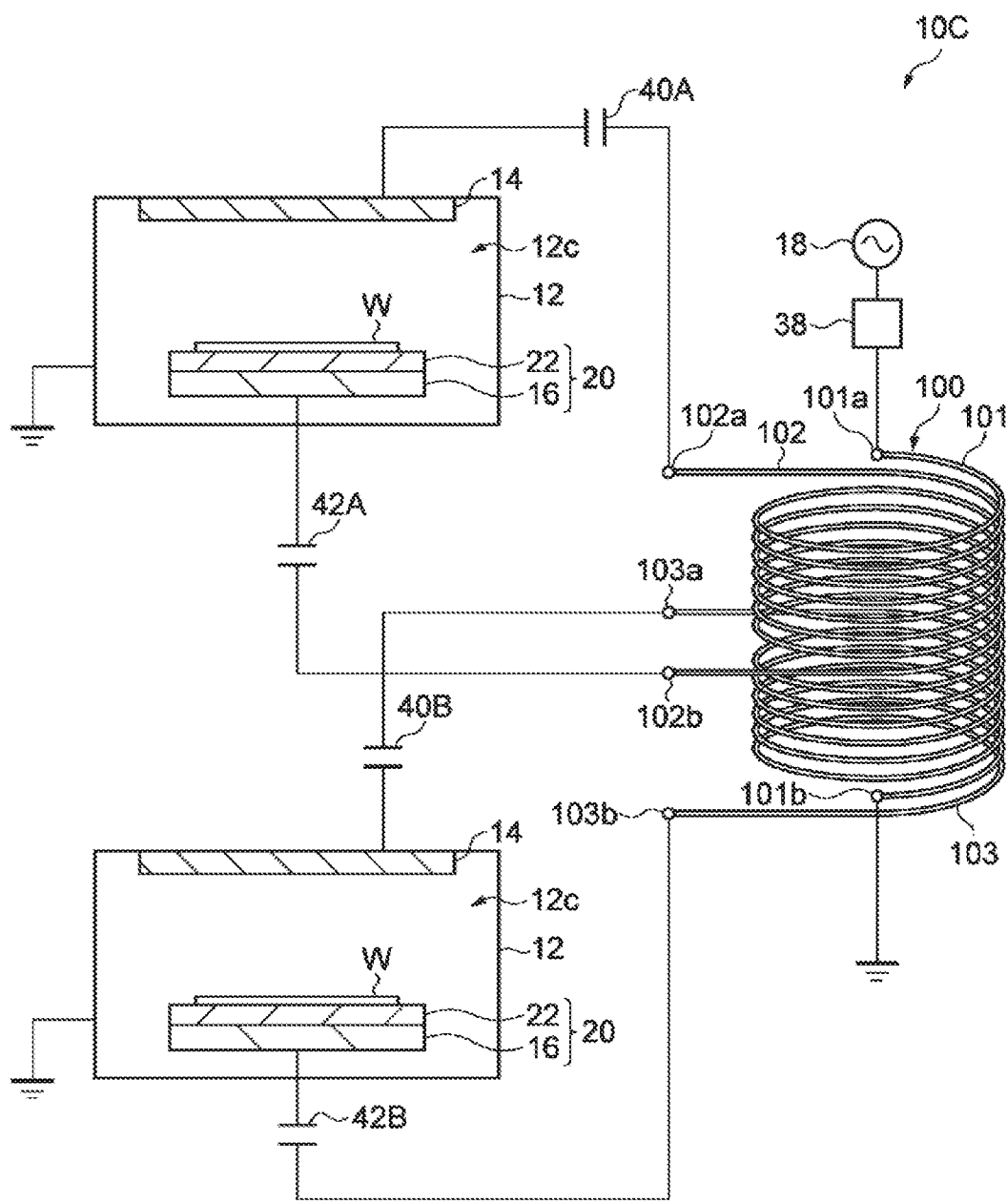
FIG. 21 is a diagram illustrating a plasma processing apparatus according to another embodiment.

FIG. 21 is a diagram illustrating a plasma processing apparatus according to still another embodiment. Hereinafter, a difference between a plasma processing apparatus 10C illustrated in FIG. 21 and the plasma processing apparatus 10A will be described and redundant descriptions will be omitted.

As illustrated in FIG. 21, in the plasma processing apparatus 10C, the other end of the second condenser 42A and the other end of the second condenser 42B float from a ground electric potential. That is to say, the other end of the second condenser 42A and the other end of the second condenser 42B are not grounded. A current having the same current value flows through one end and the other end of each of the plurality of secondary coils of the transformer 100. Thus, in the plasma processing apparatus 10C, no current flows to the chamber body 12. As a result, plasma is confined between each of the plurality of upper electrodes 14 and the respective lower electrode 16 corresponding thereto. Thus, plasma is stably generated.

Figure 22:
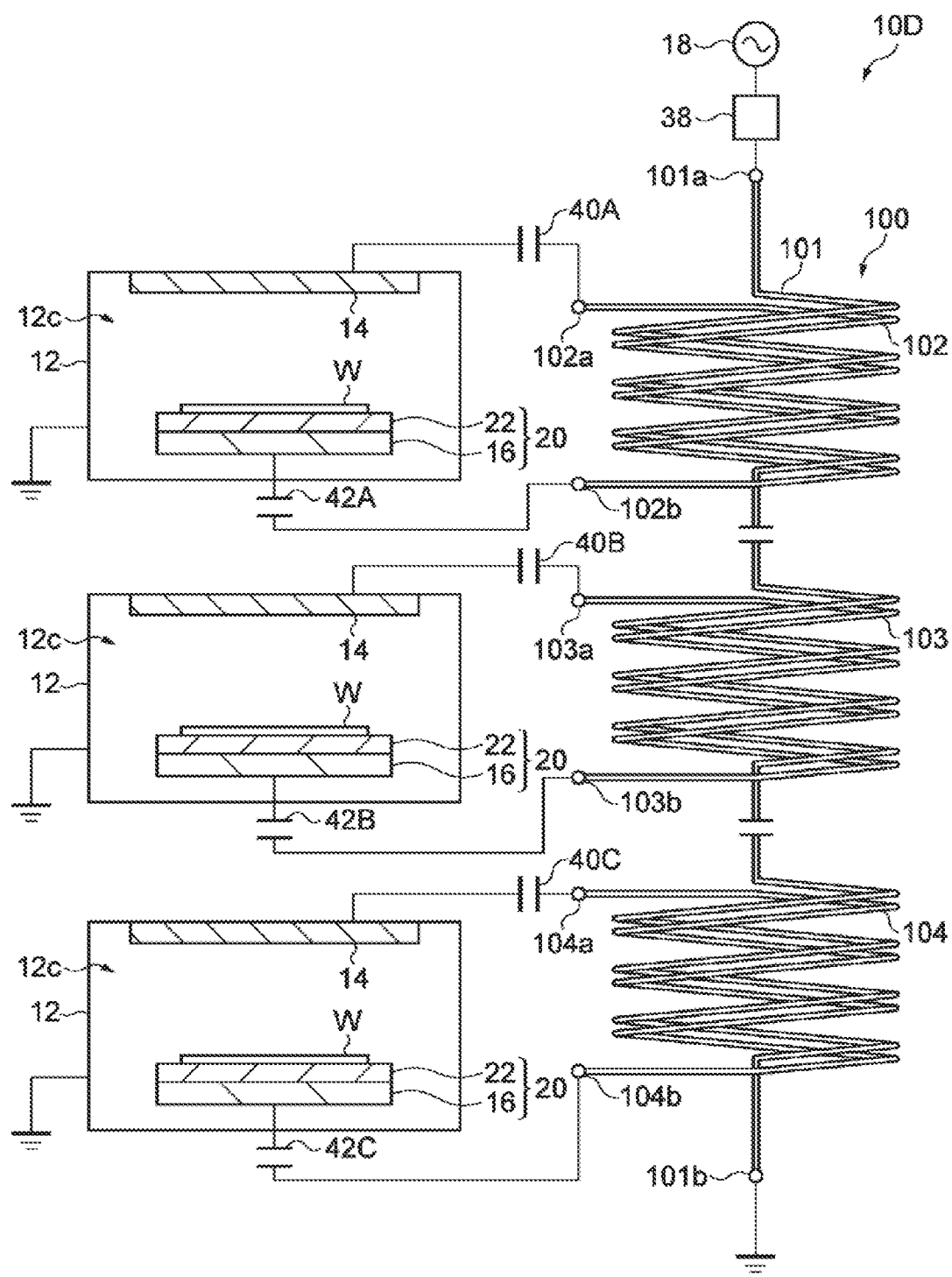
FIG. 22 is a diagram illustrating a plasma processing apparatus according to another embodiment.

FIG. 22 is a diagram illustrating a plasma processing apparatus according to still another embodiment. Hereinafter, a difference between a plasma processing apparatus 10D illustrated in FIG. 22 and the plasma processing apparatus 10B will be described and redundant descriptions will be omitted.

As illustrated in FIG. 22, in the plasma processing apparatus 10D, the other end of the second condenser 42A, the other end of the second condenser 42B, and the other end of the second condenser 42C float from a ground electric potential. That is to say, the other end of the second condenser 42A, the other end of the second condenser 42B, and the other end of the second condenser 42C are not grounded. Even in the plasma processing apparatus 10D, plasma is confined between each of the plurality of upper electrodes 14 and a respective lower electrode 16 corresponding thereto. Thus, plasma is stably generated.

Figure 23:
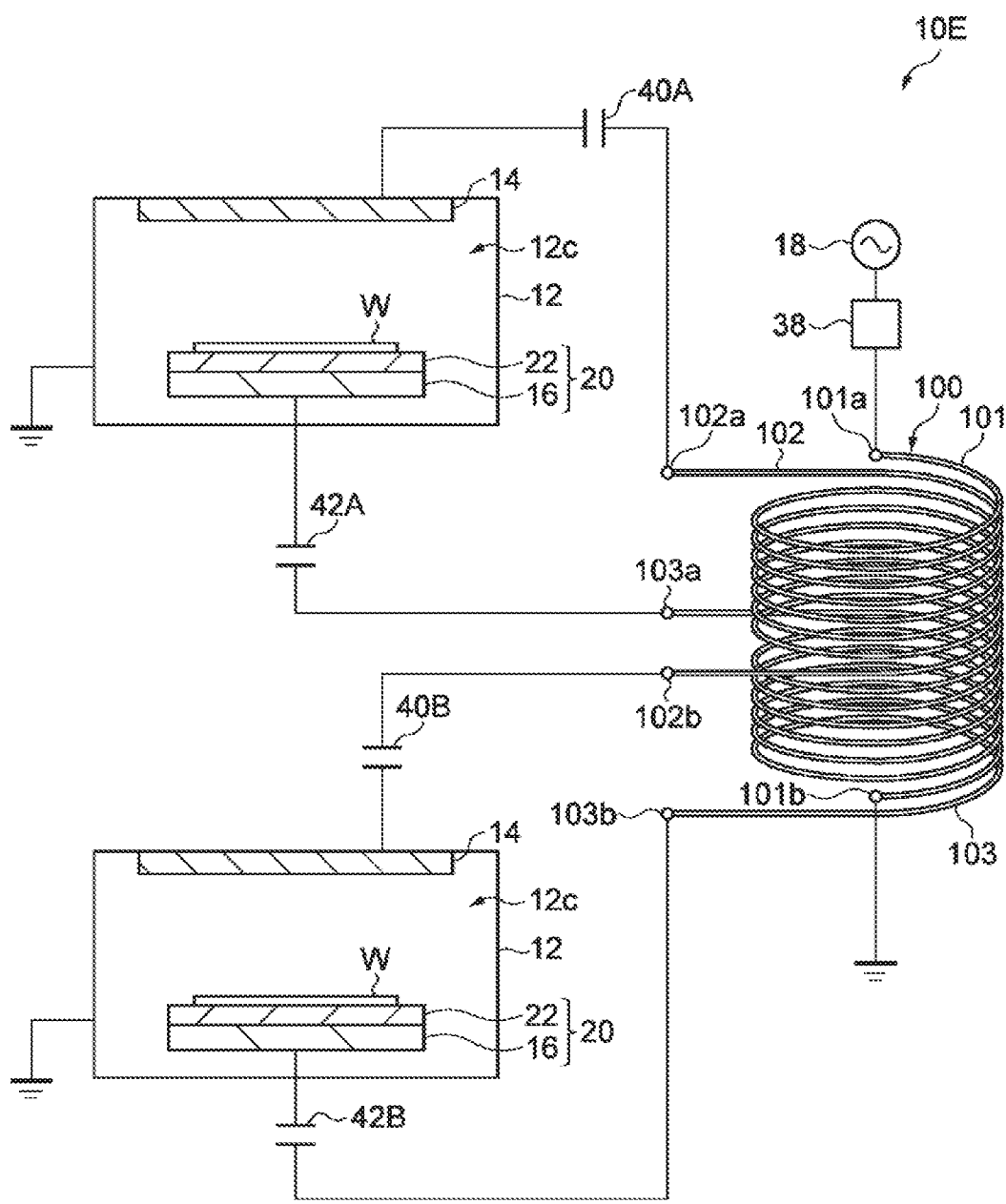
FIG. 23 is a diagram illustrating a plasma processing apparatus according to another embodiment.

FIG. 23 is a diagram illustrating a plasma processing apparatus according to still another embodiment. Hereinafter, a difference between a plasma processing apparatus 10E illustrated in FIG. 23 and the plasma processing apparatus 10C will be described and redundant descriptions will be omitted.

As illustrated in FIG. 23, in the plasma processing apparatus 10E, the terminal 103a is coupled to a first lower electrode via the second condenser 42A. The terminal 102b is coupled to a second upper electrode via the first condenser 40B.

In the plasma processing apparatus 10E, since one end (terminal 102a) and the other end (terminal 102b) of one (secondary coil 102) of the two secondary coils are respectively connected to the two upper electrodes 14, a high frequency of substantially equal electric power is supplied to the two upper electrodes 14. Further, since one end (terminal 103a) and the other end (terminal 103b) of the other (secondary coil 103) of the two secondary coils are respectively connected to the two lower electrodes 16, a high frequency of substantially equal electric power is supplied to the two lower electrodes 16. In the plasma processing apparatus 10E, by adjusting a ratio of electric power of high frequency outputted from one of the two secondary coils and electric power of high frequency outputted from the other thereof, it is possible to adjust a ratio of electric power of high frequency supplied to each of the plurality of upper electrodes 14 and electric power of high frequency supplied to the respective lower electrode 16 corresponding thereto. In addition, as described above, the adjustment of the ratio of electric power can be realized by moving, fluctuating, or rotating at least one of the plurality of secondary coils.

While various embodiments have been described above, the present disclosure is not limited thereto but may be differently modified. For example, in the embodiments of the aforementioned plasma processing apparatus, the plurality of chambers are respectively provided by the plurality of chamber bodies. However, the plurality of chambers may also be provided by dividing an internal space provided by a single chamber body using partitions. In this case, a common single system of exhaust device may be used to depressurize the plurality of chambers.

According to the present disclosure in some embodiments, it is possible to enhance the efficiency of power supply to electrodes for a plurality of chambers.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A capacitively-coupled plasma processing apparatus, comprising:
    at least one chamber body providing two chambers separated from each other, the at least one chamber body being grounded;
    first and second upper electrodes respectively installed in upper spaces within the two chambers;
    first and second lower electrodes respectively installed in lower spaces within the two chambers;
    a high frequency power supply;
    a transformer including a primary coil electrically connected to the high frequency power supply, and first and second secondary coils configured by separate wirings;
    a first condenser connected between a first end of the first secondary coil and the first upper electrode;
    a second condenser connected between a second end of the first secondary coil and the second upper electrode;
    a third condenser connected between a first end of the second secondary coil and the first lower electrode; and
    a fourth condenser connected between a second end of the second secondary coil and the second lower electrode,
    wherein the primary coil extends around a central axis,
    the first and second secondary coils are configured to be coaxially disposed with respect to the primary coil,
    each of the second ends of the third and fourth condensers floats from a ground electric potential, and
    a self-inductance of each of the first and second secondary coils is smaller than that of the primary coil.

2. The apparatus of claim 1, wherein the first to fourth condensers are fixed condensers.

3. The apparatus of claim 1, wherein a winding of each of the first and second secondary coils is wound in an alternate relationship with a winding of the primary coil.

4. The apparatus of claim 1, further comprising one or more fifth condensers,
    wherein the primary coil extends around the central axis, and includes a plurality of coils arranged along a direction in which the central axis extends, the plurality of coils and the one or more fifth condensers are alternately connected in a series relationship with each other, and the windings of the first and second secondary coils are wound in an alternate relationship with each of the windings of the plurality of coils.

5. The apparatus of claim 1, further comprising one or more fifth condensers, wherein the primary coil extends around the central axis, and includes a plurality of coils arranged along a direction in which the central axis extends, the plurality of coils and the one or more fifth condensers are alternately connected in a series relationship with each other, and the first and second secondary coils are arranged in an alternate relationship with the plurality of coils in the direction in which the central axis extends.

6. The apparatus of claim 1, wherein the primary coil is a single coil, and one of the first and second secondary coils is disposed at a first side with respect to the center of the primary coil in the direction which the central axis extends, and the other of the first and second secondary coils is disposed at a second side with respect to the center of the primary coil in the direction which the central axis extends.

7. The apparatus of claim 1, wherein each of the first and second secondary coils is configured to fluctuate around an axis extending in a direction parallel to the central axis outside a region surrounded by the primary coil.

8. The apparatus of claim 1, wherein the first and second secondary coils do not overlap each other outside the region surrounded by the primary coil when viewed in the direction parallel to the central axis.

9. The apparatus of claim 1, further comprising one or more magnetic shield plates installed between the first and second secondary coils outside the region surrounded by the primary coil.

10. The apparatus of claim 1, wherein the primary coil and the first and second secondary coils have substantially the same sectional areas.

\* \* \* \* \*